(12) United States Patent
Kunitake et al.

(10) Patent No.: US 12,283,600 B2
(45) Date of Patent: Apr. 22, 2025

(54) SEMICONDUCTOR DEVICE COMPRISING TRANSISTOR, LOAD, AND WIRING CONFIGURED TO SUPPLY POWER SUPPLY POTENTIAL TO THE LOAD

(71) Applicant: SEMICONDUCTOR ENERGY LABORATORY CO., LTD., Atsugi (JP)

(72) Inventors: Hitoshi Kunitake, Kanagawa (JP); Kazuki Tsuda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 618 days.

(21) Appl. No.: 17/615,780

(22) PCT Filed: May 22, 2020

(86) PCT No.: PCT/IB2020/054865
§ 371 (c)(1),
(2) Date: Dec. 1, 2021

(87) PCT Pub. No.: WO2020/245692
PCT Pub. Date: Dec. 10, 2020

(65) Prior Publication Data
US 2022/0238560 A1 Jul. 28, 2022

(30) Foreign Application Priority Data
Jun. 7, 2019 (JP) .................................. 2019-106637

(51) Int. Cl.
*H01L 27/14* (2006.01)
*H01L 27/12* (2006.01)
*H01L 29/786* (2006.01)

(52) U.S. Cl.
CPC ........ *H01L 27/124* (2013.01); *H01L 27/1225* (2013.01); *H01L 27/1255* (2013.01); *H01L 29/78648* (2013.01); *H01L 29/7869* (2013.01)

(58) Field of Classification Search
CPC .............. H01L 27/124; H01L 27/1225; H01L 27/1255; H01L 29/78648; H01L 29/7869;
(Continued)

(56) References Cited

U.S. PATENT DOCUMENTS 6,833,590 B2 * 12/2004 Makita ................ H01L 27/0255
257/361
7,358,555 B2 4/2008 Iwamatsu et al.
(Continued)

FOREIGN PATENT DOCUMENTS

JP 10-256489 A 9/1998
JP 2006-303377 A 11/2006
(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
(Continued)

*Primary Examiner* — Tan N Tran
(74) *Attorney, Agent, or Firm* — Fish & Richardson P.C.

(57) ABSTRACT

Malfunctions of a circuit is prevented and the reliability of a semiconductor device using the circuit is improved. The semiconductor device includes a first transistor, a second transistor, a load, and a wiring having a function of supplying a power supply potential to the load. A semiconductor layer of the first transistor includes an oxide semiconductor. A semiconductor layer of the second transistor includes an oxide semiconductor. A source and a drain of the first
(Continued)

transistor are electrically connected to the wiring. A first gate of the first transistor is supplied with a reference potential. A source and a drain of the second transistor are supplied with the reference potential. A first gate of the second transistor is electrically connected to the wiring. The semiconductor layer of the first transistor includes a region overlapping with the wiring. The semiconductor layer of the second transistor includes a region overlapping with the wiring.

3 Claims, 24 Drawing Sheets

(58) Field of Classification Search
CPC ... H01L 21/822; H01L 21/8234; H01L 27/04; H01L 27/06
USPC .............................................. 257/43, 59, 72
See application file for complete search history.

(56) References Cited

U.S. PATENT DOCUMENTS

| | | |
|---|---|---|
| 8,953,112 B2 | 2/2015 | Miyake |
| 9,117,701 B2 | 8/2015 | Tomatsu et al. |
| 9,142,611 B2 | 9/2015 | Nakanishi |
| 9,230,994 B2 | 1/2016 | Miyake |
| 10,074,576 B2 | 9/2018 | Kato |
| 11,901,822 B2 | 2/2024 | Yakubo et al. |
| 2006/0237726 A1 | 10/2006 | Iwamatsu et al. |
| 2009/0236908 A1 | 9/2009 | Park |
| 2012/0056298 A1 | 3/2012 | Kuroki |
| 2012/0062811 A1 | 3/2012 | Miyake |
| 2012/0281469 A1 | 11/2012 | Tomatsu et al. |
| 2015/0287745 A1 | 10/2015 | Kato |
| 2016/0260816 A1* | 9/2016 | Kapoor ............... H01L 29/6653 |

FOREIGN PATENT DOCUMENTS

| | | |
|---|---|---|
| JP | 2008-283633 A | 11/2008 |
| JP | 2009-231831 A | 10/2009 |
| JP | 2012-049237 A | 3/2012 |
| JP | 2012-083738 A | 4/2012 |
| JP | 2012-252769 A | 12/2012 |
| JP | 2015-153382 A | 8/2015 |
| JP | 2015-179838 A | 10/2015 |
| JP | 2017-055338 A | 3/2017 |
| KR | 2012-0028833 A | 3/2012 |
| KR | 2012-0125170 A | 11/2012 |
| WO | WO-2013/132841 | 9/2013 |

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Natsukari.Y et al., "36mW 63GHZ CMOS Differential Low-Noise Amplifier with 14GHz Bandwidth", 2009 Symposium on VLSI Circuits Digest of Technical Papers, Jun. 16, 2009, pp. 252-253.

International Search Report (Application No. PCT/IB2020/054865), dated Sep. 8, 2020.

Written Opinion (Application No. PCT/IB2020/054865), dated Sep. 8, 2020.

* cited by examiner

10

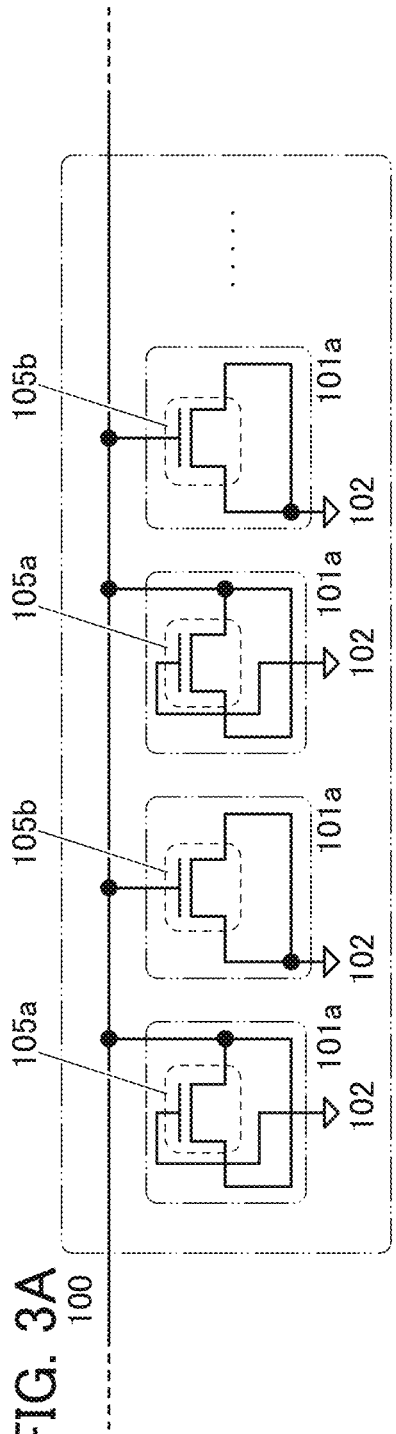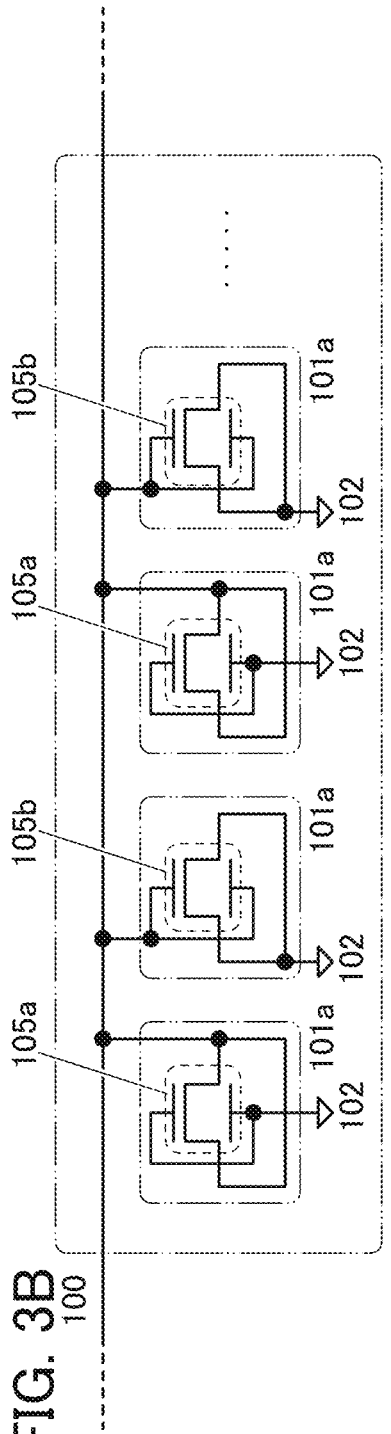

FIG. 18A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 18B
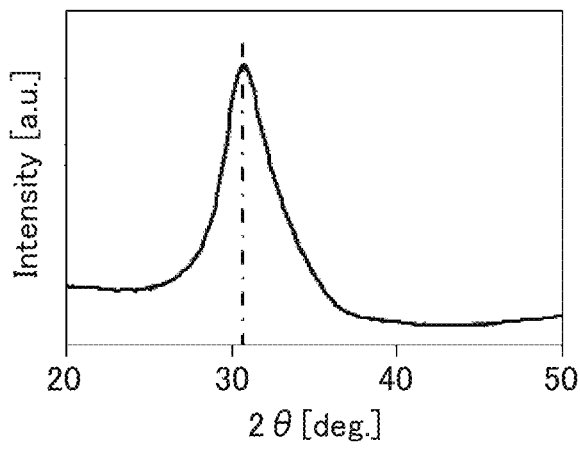
FIG. 18C
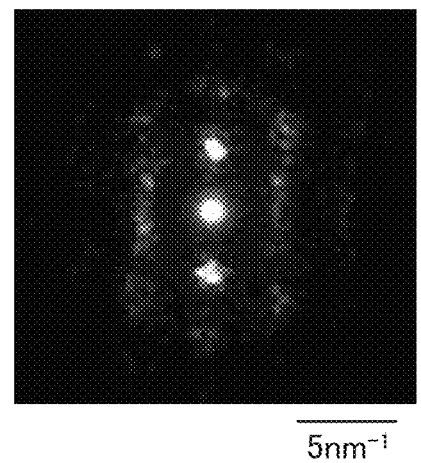

SEMICONDUCTOR DEVICE COMPRISING TRANSISTOR, LOAD, AND WIRING CONFIGURED TO SUPPLY POWER SUPPLY POTENTIAL TO THE LOAD

CROSS REFERENCE TO RELATED APPLICATIONS

This application is a U.S. National Phase Application under 35 U.S.C. § 371 of International Application PCT/IB2020/054865, filed on May 22, 2020, which is incorporated by reference and claims the benefit of a foreign priority application filed in Japan on Jun. 7, 2019, as Application No. 2019-106637.

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, an imaging device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

Portable information terminals that are easy to carry, typified by smartphones, tablet terminals, and the like, have come into widespread use. With the widespread use of portable information terminals, various communication standards have been established. For example, the use of an LTE-Advanced standard called the fourth-generation mobile communication system (4G) has started.

With the development of information technology such as Internet of Things (IoT), the amount of data handled in information terminals has been recently showing an increasing tendency. In addition, the transmission speed of electronic devices such as information terminals needs to be improved.

In order to be compatible with various kinds of information technology such as IoT, a new communication standard called the fifth-generation mobile communication system (5G) that achieves higher transmission speed, more simultaneous connections, and shorter latency than 4G has been examined. For example, 5G uses communication frequencies such as the 3.7 GHz band, the 4.5 GHz band, and the 28 GHz band.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

In addition, a c-axis aligned crystalline (CAAC) structure and a nanocrystalline (nc) structure, which are neither single crystal nor amorphous, have been found in an oxide semiconductor (see Non-Patent Document 1 and Non-Patent Document 2).

Non-Patent Document 1 and Non-Patent Document 2 also disclose a technique for fabricating a transistor using an oxide semiconductor having a CAAC structure.

REFERENCE

Non-Patent Document

[Non-Patent Document 1] S. Yamazaki et al., "Research, Development, and Application of Crystalline Oxide Semiconductor," SID Symposium Digest of Technical Papers, 2012, volume 43, issue 1, pp. 183-186

[Non-Patent Document 2] S. Yamazaki et al., "Properties of crystalline In—Ga—Zn-oxide semiconductor and its transistor characteristics," Japanese Journal of Applied Physics, 2014, volume 53, Number 4S, pp. 04ED18-1-04ED18-10

SUMMARY OF THE INVENTION

Problems to be Solved by the Invention

In an integrated circuit processing a digital signal typified by a high-frequency circuit, a high frequency noise component may flow through a power source line to cause the integrated circuit to malfunction; this makes the operation unstable. In particular, portable electronic devices, which are eagerly demanded to have low-power consumption such as cell phones and tablet terminals, are likely to malfunction because integrated circuits in these devices are driven with low power voltages and a subtle change in these voltages causes malfunction.

An object of one embodiment of the present invention is to prevent a malfunction of a circuit and to improve the reliability of a semiconductor device including the circuit. An object of one embodiment of the present invention is to reduce the power consumption of a circuit or to reduce the power consumption of a semiconductor device.

An object of one embodiment of the present invention is to prevent an increase in the layout area of a circuit provided with a means to make a bypass for a noise component to prevent the noise component from flowing through the power source line, or to reduce the size of a semiconductor device including the circuit.

An object of one embodiment of the present invention is to provide a novel semiconductor device.

Note that the description of these objects does not preclude the existence of other objects. In one embodiment of the present invention, there is no need to achieve all the objects. Other objects are apparent from and can be derived from the description of the specification, the drawings, the claims, and the like.

Means for Solving the Problems

One embodiment of the present invention is a semiconductor device including a transistor, a load, and a wiring having a function of supplying a power supply potential to the load. A semiconductor layer of the transistor comprises an oxide semiconductor. A source and a drain of the transistor are electrically connected to the wiring. A first gate of the transistor is supplied with a reference potential. The semiconductor layer of the transistor includes a region overlapping with the wiring.

One embodiment of the present invention is a semiconductor device including a transistor, a load, and a wiring having a function of supplying a power supply potential to the load. A semiconductor layer of the transistor includes an oxide semiconductor. A source and a drain of the transistor are supplied with a reference potential. A first gate of the transistor is electrically connected to the wiring. The semiconductor layer of the transistor includes a region overlapping with the wiring.

One embodiment of the present invention is a semiconductor device including a transistor, a load, and a wiring having a function of supplying a power supply potential to the load. A semiconductor layer of the transistor includes an oxide semiconductor. A first gate of the transistor includes a region overlapping with a second gate of the transistor with the semiconductor layer of the transistor therebetween. A source and a drain of the transistor are electrically connected to the wiring. The first gate of the transistor and the second gate of the transistor are supplied with a reference potential. The semiconductor layer of the transistor includes a region overlapping with the wiring.

One embodiment of the present invention is a semiconductor device including a transistor, a load, and a wiring having a function of supplying a power supply potential to the load. A semiconductor layer of the transistor includes an oxide semiconductor. A first gate of the transistor includes a region overlapping with a second gate of the transistor with the semiconductor layer of the transistor therebetween. A source and a drain of the transistor are supplied with a reference potential. The first gate of the transistor and the second gate of the transistor are electrically connected to the wiring. The semiconductor layer of the transistor includes a region overlapping with the wiring.

One embodiment of the present invention is a semiconductor device including a first transistor, a second transistor, a load, and a wiring having a function of supplying a power supply potential to the load. A semiconductor layer of the first transistor includes an oxide semiconductor. A semiconductor layer of the second transistor includes an oxide semiconductor. A source and a drain of the first transistor are electrically connected to the wiring. A first gate of the first transistor is supplied with a reference potential. A source and a drain of the second transistor are supplied with the reference potential. A first gate of the second transistor is electrically connected to the wiring. The semiconductor layer of the first transistor includes a region overlapping with the wiring. The semiconductor layer of the second transistor comprises a region overlapping with the wiring.

One embodiment of the present invention is a semiconductor device including a first transistor, a second transistor, a load, and a wiring having a function of supplying a power supply potential to the load. A semiconductor layer of the first transistor includes an oxide semiconductor. A semiconductor layer of the second transistor includes an oxide semiconductor. A first gate of the first transistor includes a region overlapping with a second gate of the first transistor with the semiconductor layer of the first transistor therebetween. A first gate of the second transistor includes a region overlapping with a second gate of the second transistor with the semiconductor layer of the second transistor therebetween. A source and a drain of the first transistor are electrically connected to the wiring. The first gate of the first transistor and the second gate of the first transistor are supplied with a reference potential. A source and a drain of the second transistor are supplied with a reference potential. The first gate of the second transistor and the second gate of the second transistor are electrically connected to the wiring. The semiconductor layer of the first transistor includes a region overlapping with the wiring. The semiconductor layer of the second transistor comprises a region overlapping with the wiring.

Effect of the Invention

According to one embodiment of the present invention, a malfunction of a circuit is prevented and the reliability of a semiconductor device including the circuit can be improved. According to one embodiment of the present invention, the power consumption of a circuit can be reduced or the power consumption of a semiconductor device can be reduced. According to one embodiment of the present invention, an increase in the layout area of a circuit can be prevented or the size of a semiconductor device including the circuit can be reduced. According to one embodiment of the present invention, a novel semiconductor device can be provided.

Note that the description of these effects does not preclude the existence of other effects. One embodiment of the present invention does not have to have all these effects. Other effects will be apparent from and can be derived from the description of the specification, the drawings, the claims, and the like.

BRIEF DESCRIPTION OF THE DRAWINGS

FIG. 3A and FIG. 3B are diagrams showing configuration examples of capacitor portions in a circuit of one embodiment of the present invention.

FIG. 18A is a table showing classifications of the crystal structures of IGZO. FIG. 18B is a graph showing an XRD spectrum of a CAAC-IGZO film. FIG. 18C is an image showing a nanobeam electron diffraction pattern of a CAAC-IGZO film.

MODE FOR CARRYING OUT THE INVENTION

Figure 1A:
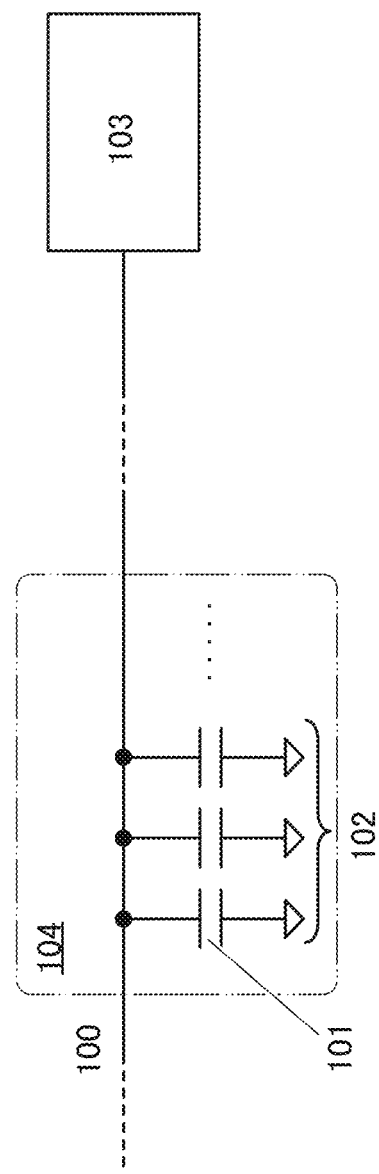
FIG. 1A is a diagram showing a configuration example of a circuit of one embodiment of the present invention.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in the structures of the invention described below, the same portions or portions having similar functions are denoted with the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which is not reflected in some cases for easy understanding.

Furthermore, in a top view (also referred to as a plan view), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current, inputs or outputs voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Therefore, the terms source and drain can be switched in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that even a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). The potential VSS refers to a power supply potential at a potential lower than the potential VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or all of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

Embodiment 1

A configuration example of a circuit 10 of one embodiment of the present invention is described. FIG. 1A shows a circuit configuration example of the circuit 10 of one embodiment of the present invention. The circuit 10 shown in FIG. 1A includes a wiring 100, capacitors 101 electrically connected to the wiring 100, and a load 103. The wiring 100 has a function of supplying a potential from a power source (hereinafter referred to as power supply potential) to the load 103. The load 103 includes a variety of circuits which drive when supplied with the power supply potential.

The power supply potential may be supplied from a power supply circuit provided in a semiconductor device or may be supplied externally to the wiring 100 through terminals provided to a semiconductor device. As the power supply potential supplied to the wiring 100, a low power supply potential (referred to as VSS), which is lower than a potential used as a reference such as a ground potential (hereinafter referred to as reference potential) and a high power supply potential, which is higher than the reference potential (referred to as VDD), are given.

One electrode of the capacitor 101 is electrically connected to the wiring 100 and the other electrode is electrically connected to the wiring 102 which is supplied with the reference potential. The number of capacitors 101 may be one or more. FIG. 1A shows an example in which a plurality of capacitors 101 are connected in parallel and a portion including the plurality of capacitors 101 connected in parallel is shown as a capacitor portion 104.

When a noise component, which is an unnecessary high frequency signal, is supplied to the wiring 100 with the power supply potential, the capacitor 101 lets the noise component flow to the wiring 102; the capacitor 101 has a function of preventing the noise component from being supplied to the load 103.

Figure 1B:
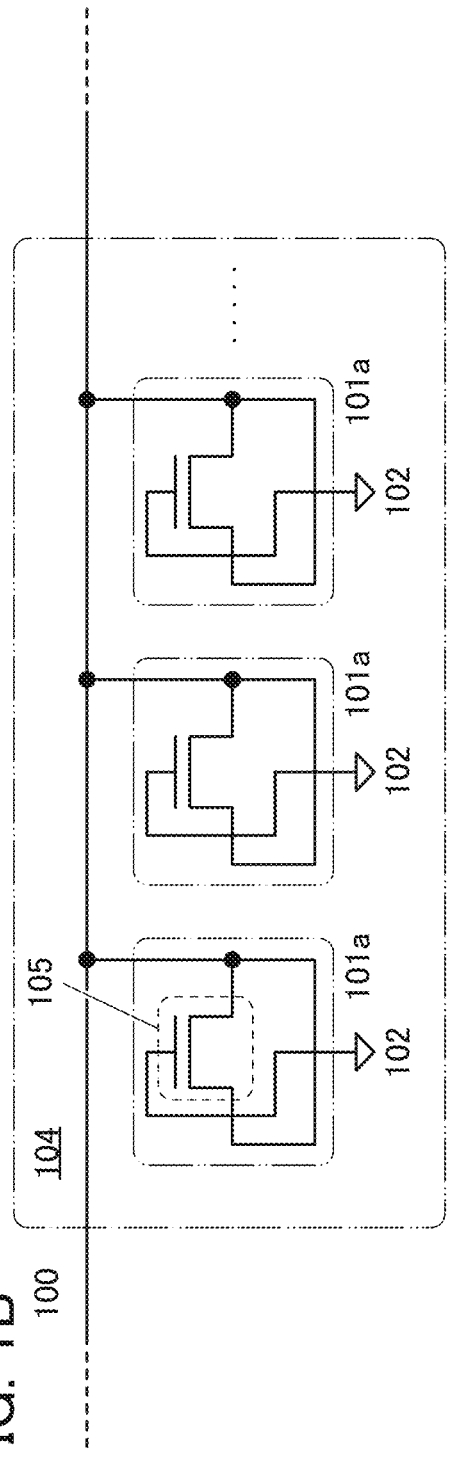
FIG. 1B is a diagram showing a configuration example of a capacitor portion in a circuit of one embodiment of the present invention.

In one embodiment of the present invention, a transistor is used as the capacitor 101. FIG. 1B shows an example of a circuit configuration of the capacitor portion 104 when a transistor is used for the capacitor 101 of the capacitor portion 104 shown in FIG. 1A. The capacitor portion 104 shown in FIG. 1B includes one or more of capacitors 101a which correspond to a variation of the capacitor 101. The capacitor 101a includes a transistor 105, and a source and a drain of the transistor 105 are electrically connected to each other. The source and the drain of the transistor 105 functions as one electrode of the capacitor 101a, and a gate of the transistor 105 functions as the other electrode thereof. FIG. 1B shows an example in which the source and the drain of the transistor 105 are electrically connected to the wiring 100 and the gate of the transistor 105 is electrically connected to the wiring 102.

As the transistor 105, a transistor with a channel formation region in an amorphous, microcrystalline, polycrystalline, or single crystalline semiconductor film of silicon, germanium, or the like (also referred to as Si transistor) can be used. In the case where the transistor 105 is formed using a thin silicon film, any of the following can be used:

amorphous silicon deposited using a sputtering method or a vapor phase growth method such as a plasma CVD method, polycrystalline silicon obtained using crystallization of amorphous silicon by means of treatment such as laser annealing, single crystal silicon obtained through separation of a surface portion of a single crystal silicon wafer through implantation of hydrogen ions or the like into the silicon wafer, and the like.

As the transistor 105, a transistor with a channel formation region in a semiconductor film including an oxide semiconductor (OS), which is a kind of metal oxides (also referred to as "OS transistor" or "OS-FET"), can be used. When an OS transistor is used as the capacitor 101a, the capacitance value of the capacitor 101a per area in a plan view can be higher than the case where a Si transistor is used as the capacitor 101a. Since an OS transistor is used as the capacitor 101a, an increase in the layout area of the circuit of the present invention can be prevented. The size of a semiconductor device including the circuit can be reduced.

Figure 2A:
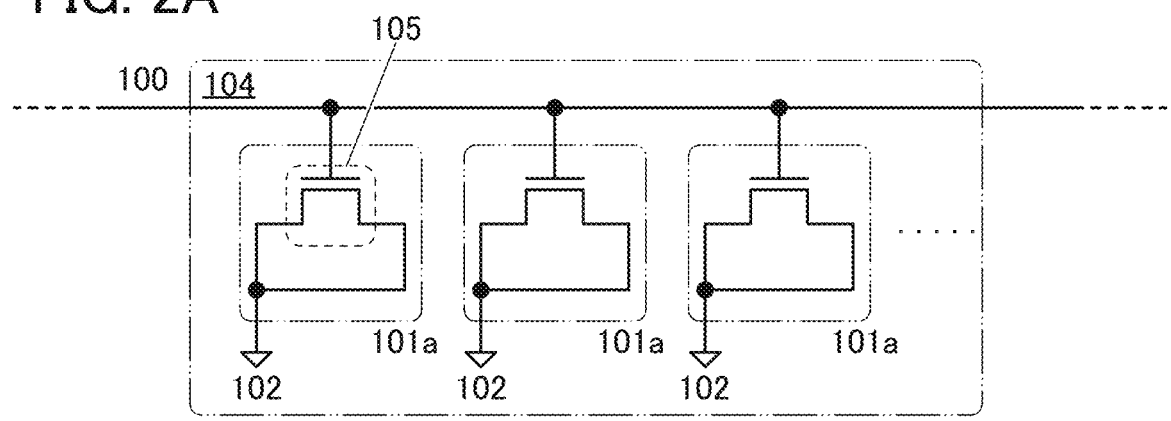
FIG. 2A to FIG. 2C are diagrams showing configuration examples of capacitor portions in a circuit of one embodiment of the present invention.

FIG. 1B shows an example of the capacitor portion 104 in which the source and the drain of the transistor 105 are electrically connected to the wiring 100 and the gate of the transistor 105 is electrically connected to the wiring 102; the connection relation of the transistor 105 to the wiring 100 and the wiring 102 can be opposite to that of FIG. 1B. FIG. 2A shows an example of a circuit configuration of the capacitor portion 104 which has the connection relation of the transistor 105 to the wiring 100 and the wiring 102 opposite to that of FIG. 1B.

In the capacitor portion 104 in FIG. 2A, like the capacitor portion 104 in FIG. 1B, the capacitor 101a includes the transistor 105 and the source and the drain of the transistor 105 are electrically connected to each other. FIG. 2A shows an example in which the gate of the transistor 105 is electrically connected to the wiring 100 and the source and the drain of the transistor 105 are electrically connected to the wiring 102.

Figure 2B:
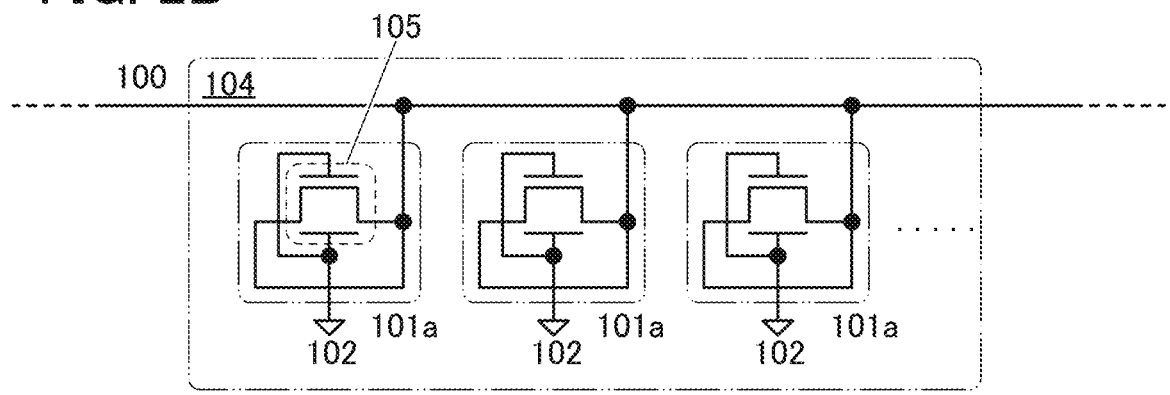

In one embodiment of the present invention, the transistor 105 may include two gates (also referred to as front gate and back gate) which have regions overlapping with each other with a channel formation region therebetween. The two gates may be electrically connected to each other. FIG. 2B shows an example of a circuit configuration of the capacitor portion 104 in which the transistor 105 including two gates is used as the capacitor 101a.

In the capacitor portion 104 in FIG. 2B, the capacitor 101a includes the transistor 105, and the transistor 105 includes two gates. In the transistor 105, the two gates are electrically connected to each other, and the source and the drain are electrically connected to each other. In the capacitor 101a, the source and the drain of the transistor 105 function as one electrode, and the two gates of the transistor 105 function as the other electrode. FIG. 2B shows an example in which the source and the drain of the transistor 105 are electrically connected to the wiring 100 and the gate of the transistor 105 is electrically connected to the wiring 102.

When the transistor 105 including two gates is used as the capacitor 101a, the capacitance value of the capacitor 101a per area in a plan view can be higher than the case where the transistor 105 with one gate is used as the capacitor 101a. Accordingly, when the transistor 105 including two gates is used as the capacitor 101a, an increase in the layout area of the circuit can be prevented. The size of a semiconductor device including the circuit can be reduced.

When a bulk transistor formed on a semiconductor substrate is used as the transistor 105, the gate of the transistor 105 is electrically connected to the body of the transistor 105, whereby the capacitance value of the capacitor 101a per area in a plan view can be increased as in the thin-film transistor 105 with two gates electrically connected to each other.

Figure 2C:
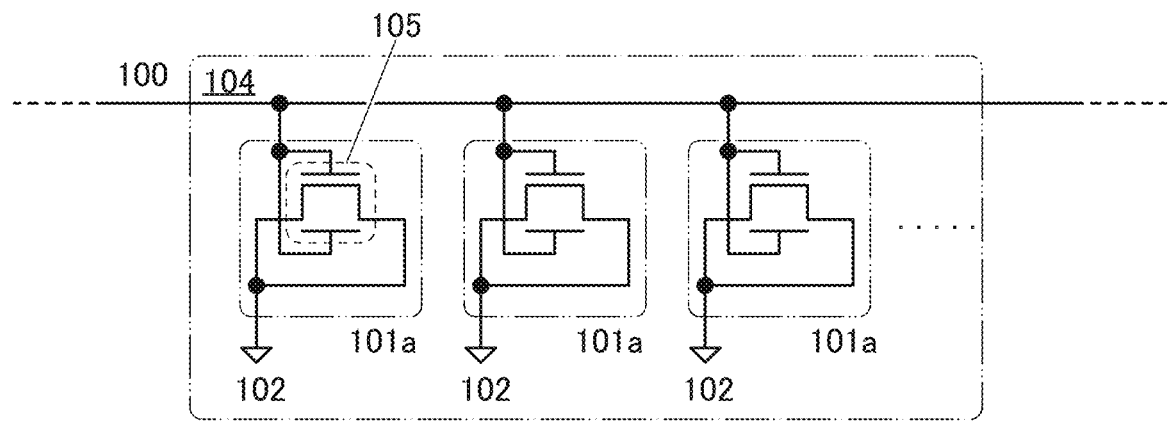

FIG. 2B shows an example of the capacitor portion 104 in which the source and the drain of the transistor 105 are electrically connected to the wiring 100 and the two gates of the transistor 105 are electrically connected to the wiring 102; the connection relation of the transistor 105 to the wiring 100 and the wiring 102 can be opposite to that of FIG. 2B. FIG. 2C shows an example of a circuit configuration of the capacitor portion 104 which has the connection relation of the transistor 105 to the wiring 100 and the wiring 102 opposite to that of FIG. 2B.

In the capacitor portion 104 in FIG. 2C, like the capacitor portion 104 shown in FIG. 2B, the capacitor 101a includes the transistor 105 and the source and the drain of the transistor 105 are electrically connected to each other. FIG. 2C shows an example in which two gates of the transistor 105 are electrically connected to the wiring 100 and the source and the drain of the transistor 105 are electrically connected to the wiring 102.

When the capacitor portion 104 includes a plurality of capacitors 101a, the sources and the drains of the transistors 105 may be electrically connected to each other in all the capacitors 101a as in the capacitor portion 104 shown in FIG. 1A and FIG. 2B, or the transistors 105 whose sources and drains are electrically connected to the wiring 100 and the transistors 105 whose gates are electrically connected to the wiring 100 may be included in the capacitor portion 104.

FIG. 3A shows an example of a circuit configuration of the capacitor portion 104 in which the transistors 105 whose sources and drains are electrically connected to the wiring 100 and the transistors 105 whose gates are electrically connected to the wiring 100 are included in the capacitor portion 104. In FIG. 3A, the transistors 105 whose sources and drains are electrically connected to the wiring 100 are shown as the transistors 105a, and the transistors 105 whose gates are electrically connected to the wiring 100 are shown as transistors 105b.

FIG. 3A shows an example of a circuit configuration of the capacitor portion 104 in which the transistors 105a and the transistors 105b include front gates and no back gates; the capacitor portion 104 may have the transistors 105a and the transistors 105b whose front gates and back gates are electrically connected to each other as shown in FIG. 3B.

A capacitance value of a capacitor formed between a gate and a source or a drain of a transistor changes depending on a value of a voltage applied between the gate and the source of the transistor. When the capacitor portion 104 includes both the transistor 105a and the transistor 105b as shown in FIG. 3A and FIG. 3B, a change of the capacitance value of the combined capacitance of the entire capacitor portion 104 due to a change of the power supply potential of the wiring 100 can be prevented.

When the sources and the drains of the transistor 105 are connected to the wiring 100 in all the capacitors 101a or the gates of the transistors 105 are connected to the wiring 100 in all the capacitors 101a as in the capacitor portions 104 shown in FIG. 1A and FIG. 2B, the periodicity of a layout pattern of a mask used for forming the capacitor portion 104 can be improved. In the case where the periodicity of a layout pattern of a mask is high, shape defects, e.g., a partial reduction in the width of a conductive film, an insulating film, a semiconductor film, or the like formed by photolithography due to interference of light emitted from an exposure apparatus, are less likely to occur in the photolithography process using the mask because of interference of light emitted from an exposure apparatus. This can prevent shape defects in a conductive film, an insulating film, and a semiconductor film after a process of photolithography and improve the yield of manufacturing a circuit or a semiconductor device including the circuit.

Figure 4:
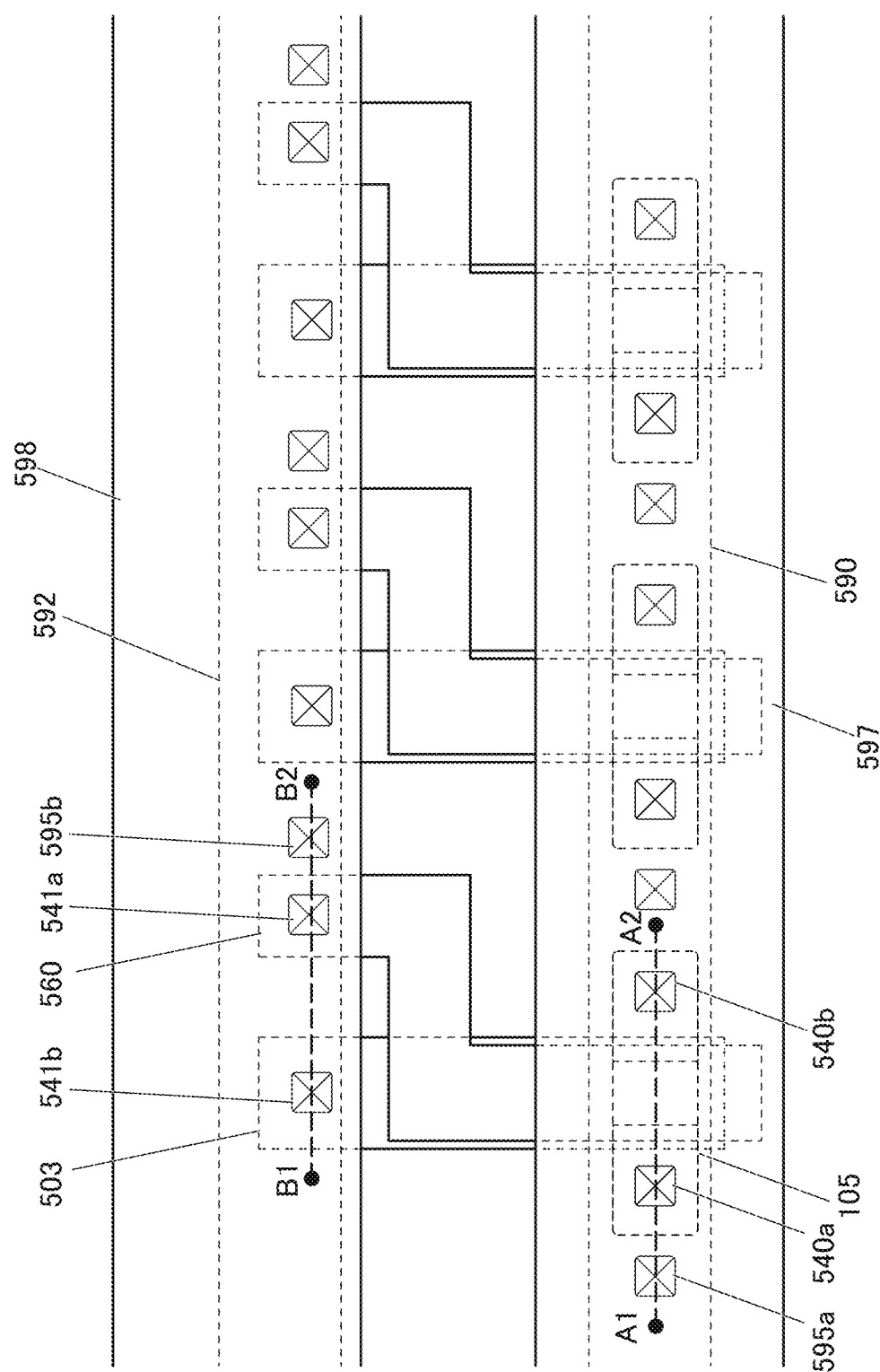
FIG. 4 is a diagram showing a configuration example of a capacitor portion in a circuit of one embodiment of the present invention.
Figure 5:
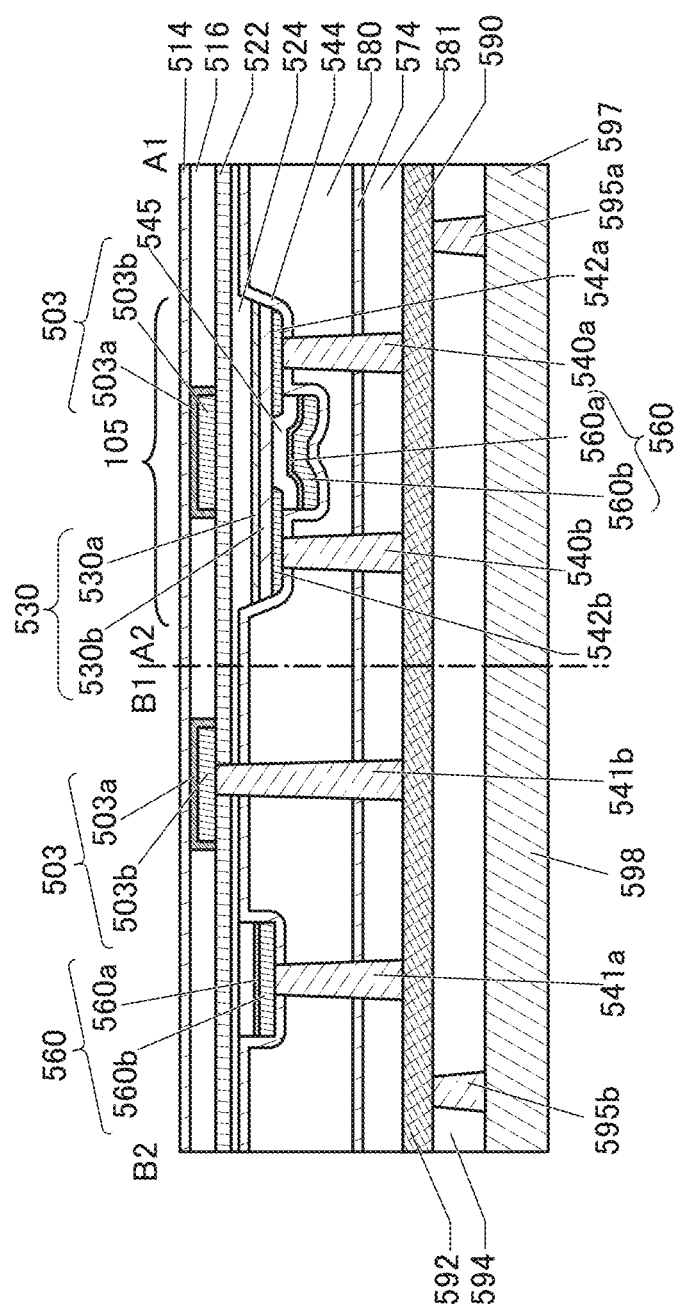
FIG. 5 is a diagram showing a structure example of a capacitor portion in a circuit of one embodiment of the present invention.

In one embodiment of the present invention, the transistor 105 is provided in a region overlapping with the wiring 100 or the wiring 200 in a cross-sectional view. FIG. 4 shows an example of a layout of the capacitor portion 104 shown in FIG. 2B in a plan view. FIG. 5 shows a cross-sectional view taken along the dashed line A1-A2 and a cross-sectional view taken along the dashed line B1-B2 in FIG. 4. In FIG. 4 and FIG. 5, the transistor 105 is an OS transistor.

In FIG. 5, an insulator 516 is stacked over an insulator 514. The transistor 105 is provided over the insulator 514 and the insulator 516.

The transistor 105 includes the conductor 503 positioned to be embedded in the insulator 514 and the insulator 516; an insulator 522 positioned over the insulator 516 and the insulator 503; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 545 positioned over the conductor 542a and the conductor 542b; and a conductor 560 positioned on a formation surface of the insulator 545.

As shown in FIG. 5, an insulator 544 is preferably provided to cover the conductor 542a, the conductor 542b, and the conductor 560. The conductor 560 preferably includes a conductor 560a over the insulator 545 and a conductor 560b over the conductor 560a. The insulator 580, an insulator 574, and an insulator 581 are stacked in this order over the insulator 544. The conductor 542a and the conductor 542b each have a function of a source or a drain. The conductor 560 has a function of a front gate.

Note that in this specification and the like, the oxide 530a and the oxide 530b are sometimes collectively referred to as an oxide 530.

In the conductor 503, the conductor 503a is formed in contact with a recessed portion formed with an opening in the insulator 514 and the insulator 516, and the conductor 503b is formed further inside. Note that although the transistor 105 having a structure in which the conductor 503a and the conductor 503b are stacked is shown, the present invention is not limited thereto. For example, the conductor 503 may have a single-layer structure or a stacked-layer structure of three or more layers. The conductor 503 has a function of a back gate.

In openings formed in the insulator 522, the insulator 524, the insulator 544, the insulator 580, the insulator 574, and the insulator 581, a conductor 540a, a conductor 540b, a conductor 541a, and a conductor 541b are provided. The conductor 540a is electrically connected to the conductor 542a, and the conductor 540b is electrically connected to the conductor 542b. The conductor 560 includes a region not overlapping with the oxide 530. One of openings formed in the insulator 544, the insulator 580, the insulator 574, and the insulator 581 overlaps with the region and through the one of openings, the conductor 541a is electrically connected to the conductor 560.

The conductor 503 includes a region not overlapping with the oxide 530. One of the openings formed in the insulator 522, the insulator 524, the insulator 544, the insulator 580, the insulator 574, and the insulator 581 overlaps with the region and through the one of the openings, the conductor 541b is electrically connected to the conductor 503.

A conductor 590 and a conductor 592 are provided over the insulator 581. The conductor 590 is electrically connected to the conductor 540a and the conductor 540b, and the conductor 592 is electrically connected to the conductor 541a and the conductor 541b. With the above structure, the source and the drain of the transistor 105 are electrically connected to each other, and the front gate and the back gate of the transistor 105 are electrically connected to each other.

In one embodiment of the present invention, the back gate and the front gate are not necessarily supplied with the same potential. By changing a potential applied to the back gate independently of a potential applied to the front gate, the threshold voltage of the transistor 105 can be controlled. In particular, the threshold voltage of the transistor 105 can be higher than 0 V and the off-state current can be reduced by applying a negative potential to the conductor 503.

An insulator 594 is provided over the insulator 581, the conductor 590, and the conductor 592. A conductor 595a and a conductor 595b are provided in openings formed in the insulator 594. The conductor 595a is electrically connected to the conductor 590, and the conductor 595b is electrically connected to the conductor 592. A conductor 597 and a conductor 598 are provided over the insulator 594. The conductor 597 is electrically connected to the conductor 595a, and the conductor 598 is electrically connected to the conductor 595b. The conductor 597 has a function of the wiring 100, and the conductor 598 has a function of the wiring 102.

FIG. 4 and FIG. 5 show the structure example of the capacitor portion 104 in FIG. 2B; the capacitor portion 104 shown in FIG. 2C can have the same structure of FIG. 4 and FIG. 5. Note that in the case of the capacitor portion 104 in FIG. 2C, the conductor 597 has a function of the wiring 102 and the conductor 598 has a function of the wiring 100.

FIG. 4 and FIG. 5 show a structure example in which the oxide 530 of the transistor 105 overlaps with the conductor 597; the oxide 530 of the transistor 105 may overlap with the conductor 598. In the case where the oxide 530 of the transistor 105 overlaps with the conductor 598, the conductor 590 is made to extend from a region overlapping with the conductor 597 to a region overlapping with the conductor 598, whereby the conductor 540a, the conductor 540b, and the conductor 598 can be electrically connected to each other through the conductor 590.

Figure 6:
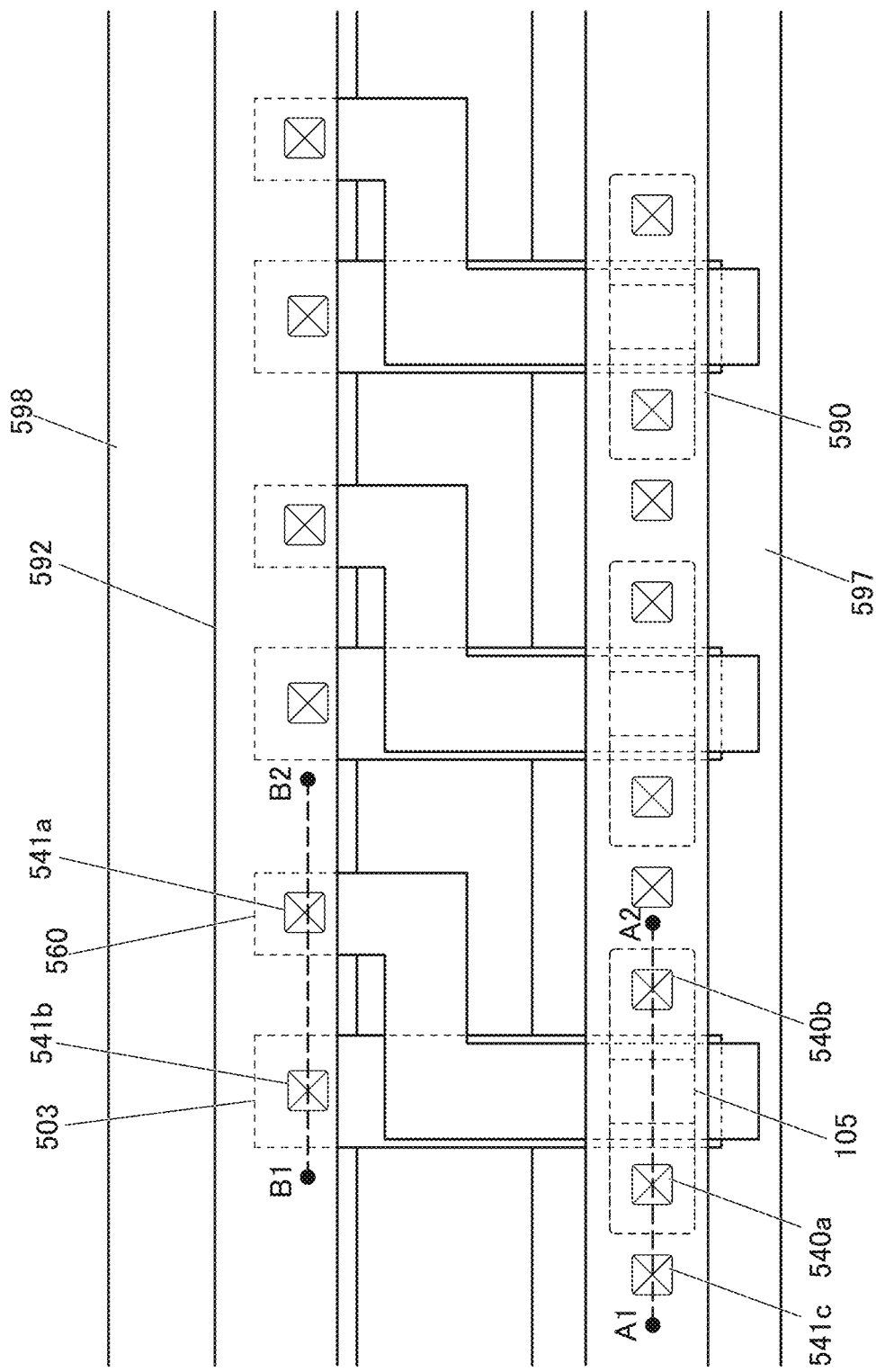
FIG. 6 is a diagram showing a configuration example of a capacitor portion in a circuit of one embodiment of the present invention.
Figure 7:
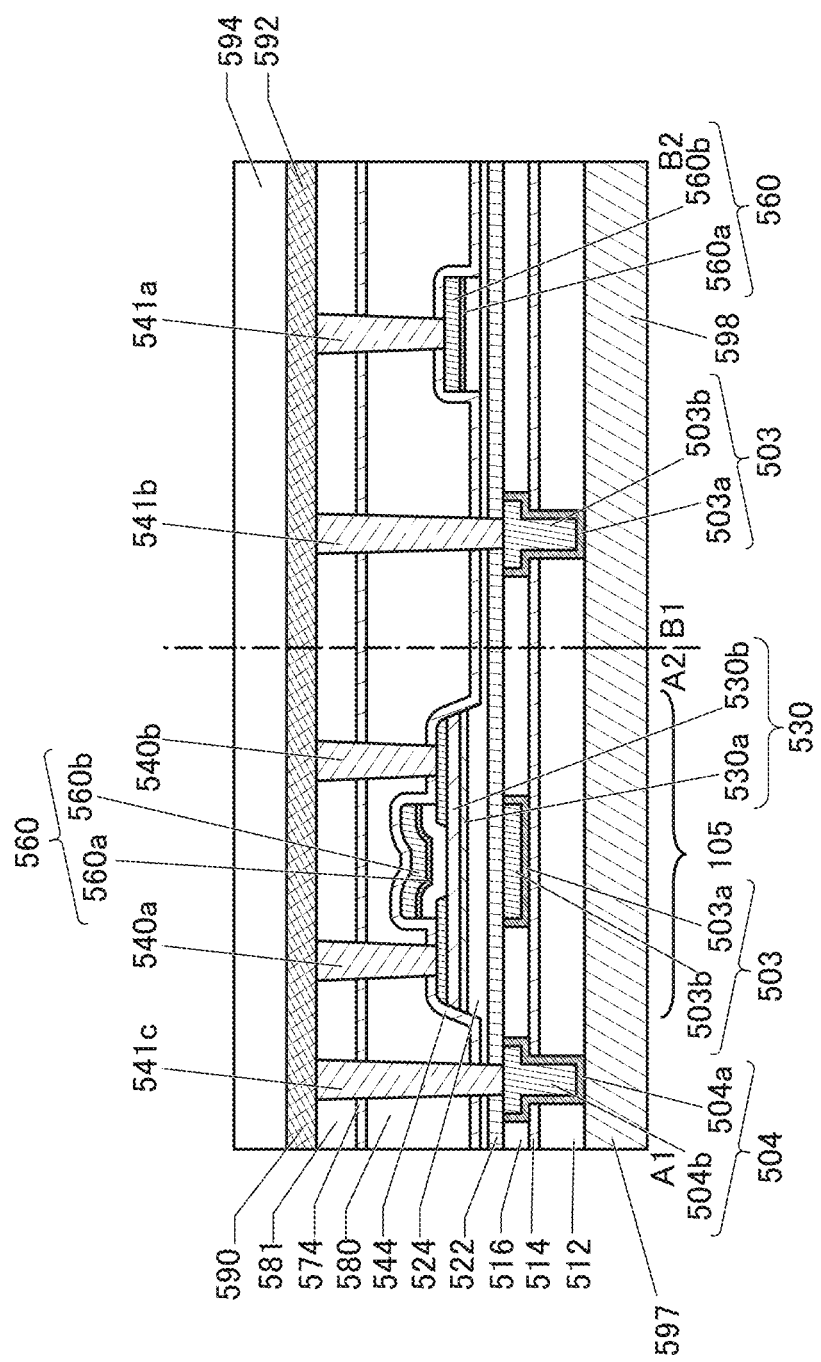
FIG. 7 is a diagram showing a structure example of a capacitor portion in a circuit of one embodiment of the present invention.

FIG. 4 and FIG. 5 show a structure example in which the transistor 105 is provided in a layer under the conductor 597; the transistor 105 may be provided in a layer over the conductor 597. FIG. 6 shows an example of a layout in a plan view of the capacitor portion 104 shown in FIG. 2B in which the transistor 105 is provided in a layer over the conductor 597. FIG. 7 shows a cross-sectional view taken along the dashed line A1-A2 and a cross-sectional view taken along the dashed line B1-B2 in FIG. 6. In FIG. 6 and FIG. 7, the transistor 105 is an OS transistor.

FIG. 6 and FIG. 7 are different from FIG. 4 and FIG. 5 at least in that an insulator 512 is provided under the insulator 514, and the conductor 597 and the conductor 598 are provided under the insulator 512. In addition, in FIG. 6 and FIG. 7, a conductor 541c is provided besides the conductor 541b in an opening formed in the insulator 522, the insulator 524, the insulator 544, the insulator 580, the insulator 574, and the insulator 581. The conductor 541c is electrically connected to the conductor 590 over the insulator 581. With the above structure, the source and the drain of the transistor 105 are electrically connected to each other.

In FIG. 6 and FIG. 7, a conductor 504 is embedded in the insulator 512, the insulator 514, and the insulator 516. The conductor 504 is electrically connected to the conductor 597 provided under the conductor 504. The conductor 504 is electrically connected to the conductor 541c provided over the conductor 504.

Specifically, the conductor 504 is formed in the following manner: a conductor 504a is formed in contact with an inner wall of a recessed portion which is formed with the conductor 597, an opening in the insulator 512, an opening in the insulator 514, and an opening in the insulator 516; a conductor 504b is formed therein. For example, the conductor 504 may have a single-layer structure or a stacked-layer structure of three or more layers.

In FIG. 6 and FIG. 7, the conductor 503 in a region not overlapping with the oxide 530 is electrically connected to the conductor 598 provided under the conductor 503 through an opening in the insulator 512, an opening in the insulator 514, and an opening in the insulator 516, which is different from FIG. 3 and FIG. 4.

In one embodiment of the present invention, the transistor 105 is provided in a region overlapping with the conductor 597 which has a function of the wiring 100, as shown in FIG. 4 and FIG. 5, or FIG. 6, and FIG. 7. With the above structure, even when the capacitor portion 104 is provided in the circuit as shown in FIG. 1 to FIG. 3, an increase in area of the circuit in a plan view can be prevented. Thus, the size of a semiconductor device including the circuit can be reduced.

This embodiment can be implemented in appropriate combination with the other embodiments.

Embodiment 2

Figure 8:
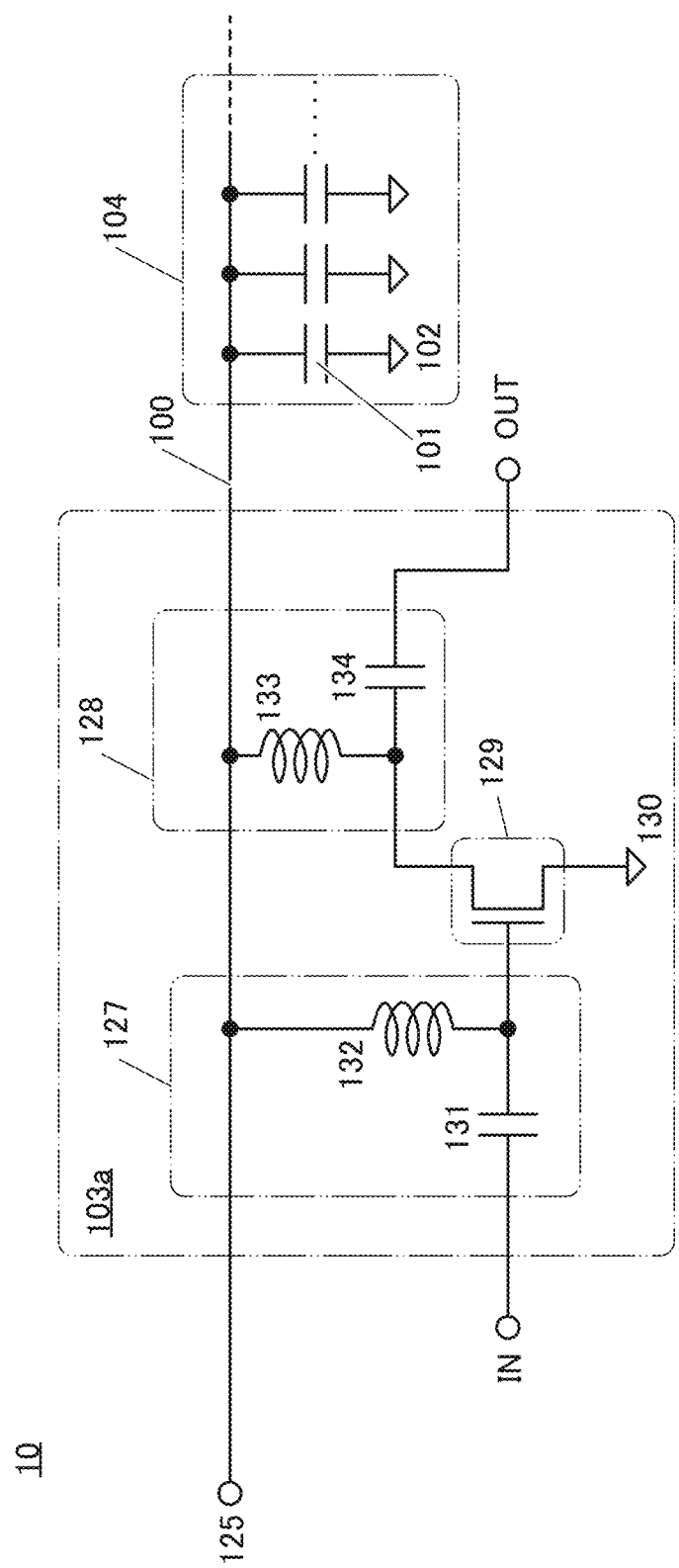
FIG. 8 is a diagram showing a configuration example of a circuit of one embodiment of the present invention.

Next, a structure example of the circuit 10 of one embodiment of the present invention in the case where a common source amplifier 103a is used as the load 103 is described. The circuit 10 in FIG. 8 includes the common source amplifier 103a, the wiring 100, and the capacitor portion 104. The common source amplifier 103a includes a matching circuit 127, a matching circuit 128, and a transistor 129. The matching circuit 127 includes an inductor 132 and a capacitor 131. The matching circuit 128 includes an inductor 133 and a capacitor 134.

In the matching circuit 127, one terminal of the inductor 132 is electrically connected to the wiring 100, and the other terminal thereof is electrically connected to a gate of the transistor 129. One electrode of the capacitor 131 is electrically connected to an input terminal IN, and the other electrode thereof is electrically connected to a gate of the transistor 129.

In the matching circuit 128, one terminal of the inductor 133 is electrically connected to the wiring 100, and the other terminal thereof is electrically connected to one of a source and a drain of the transistor 129. One electrode of the capacitor 134 is electrically connected to one of the source and the drain of the transistor 129, and the other electrode thereof is electrically connected to an output terminal OUT.

The other of the source and the drain of the transistor 129 is electrically connected to a wiring 130. Note that a potential applied to the wiring 130 may be substantially equal to a potential applied to the wiring 102.

A potential is supplied to the wiring 100 from a terminal 125. In the circuit 10 of one embodiment of the present invention, even when a noise component is included in a potential supplied from the terminal 125 to the wiring 100, the noise component can be made to flow to the wiring 102 through the capacitor 101, whereby the noise component is prevented from being supplied to the common source amplifier 103a. In one embodiment of the present invention, the capacitor 101 overlaps with a region where the wiring 100 is provided, whereby the size of the circuit 10 can be reduced.

Figure 9:
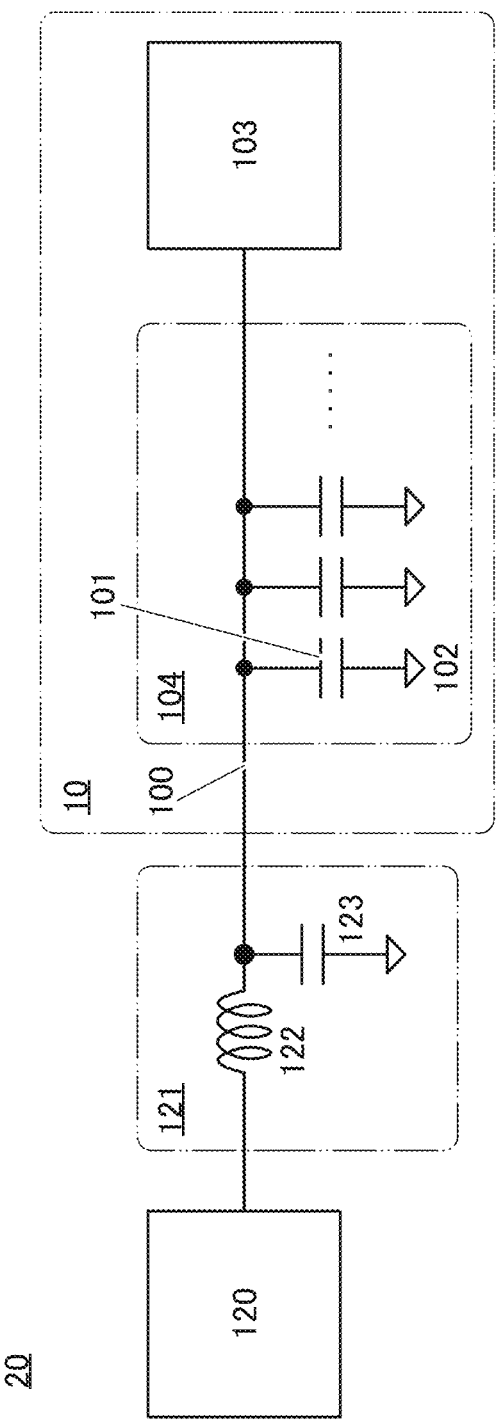
FIG. 9 is a diagram showing a configuration example of a semiconductor device of one embodiment of the present invention.

Next, a structure example of a semiconductor device 20 including the circuit 10 of one embodiment of the present invention is described. The semiconductor device 20 in FIG. 9 includes a DC-DC converter 120, a smoothing circuit 121, and the circuit 10. The circuit 10 includes the wiring 100, the capacitor portion 104, and the load 103.

The smoothing circuit 121 includes an inductor 122 and a capacitor 123. One terminal of the inductor 122 is supplied with a potential output from the DC-DC converter 120, and the other terminal thereof is electrically connected to the wiring 100.

The smoothing circuit 121 removes variations of a waveform such as ripple from a potential output from the DC-DC converter 120; the potential is input to the capacitor portion 104 through the wiring 100. In the semiconductor device 20 of one embodiment of the present invention, a noise component corresponding to a change in the potential which is not removed by the smoothing circuit 121 is made to flow in the wiring 102 through the capacitor 101, whereby the noise component is prevented from being supplied to the load 103. In one embodiment of the present invention, the capacitor 101 overlaps with a region where the wiring 100 is provided, whereby the size of the semiconductor device 20 can be reduced.

This embodiment can be implemented in appropriate combination with the other embodiments.

Embodiment 3

Figure 10:
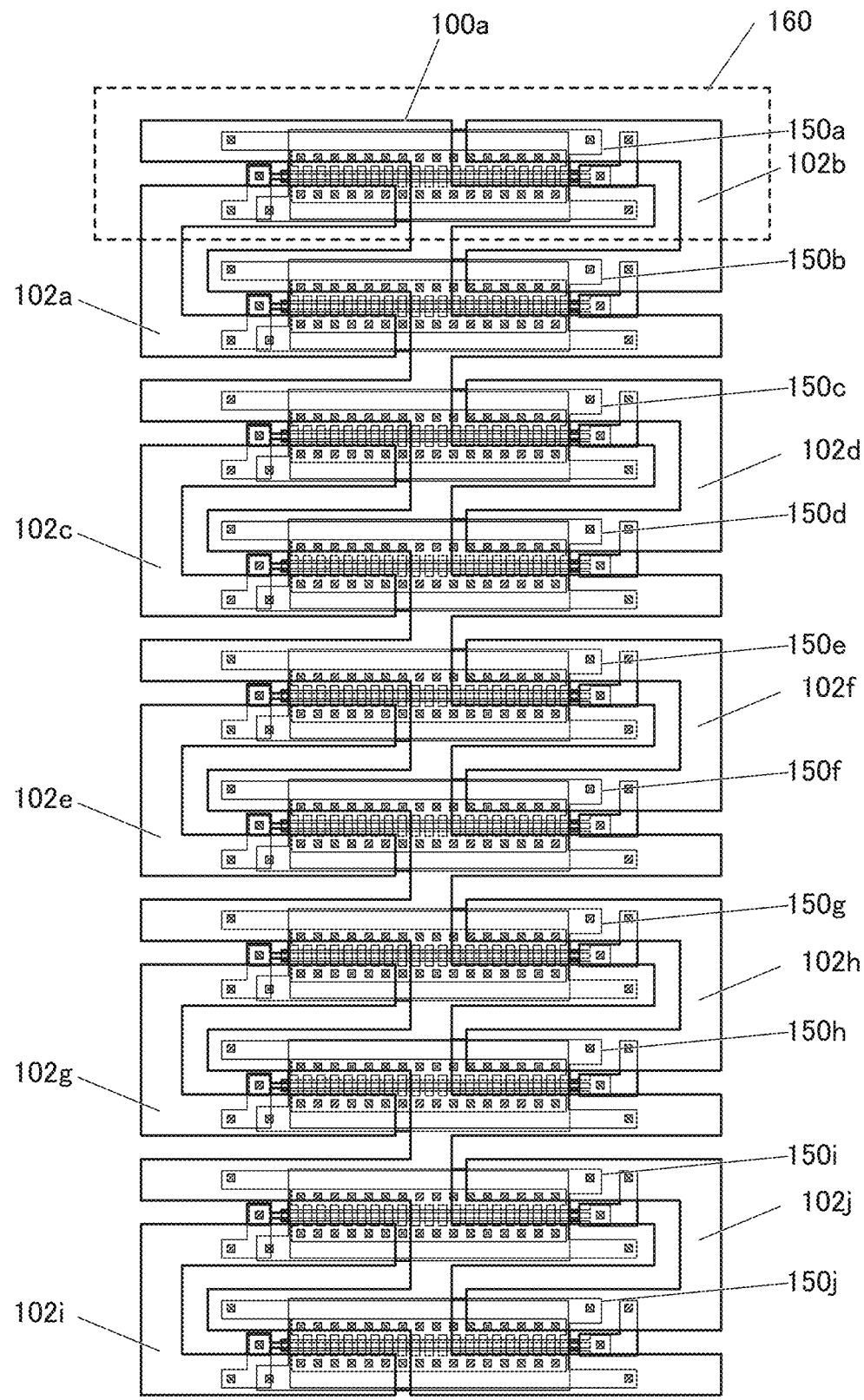
FIG. 10 is a diagram showing a configuration example of a capacitor portion in a circuit of one embodiment of the present invention.

In this embodiment, an example of a specific layout of the wiring 100, the wiring 102, and the capacitor portion 104 included in the circuit 10 is described. FIG. 10 shows an example of a top view of the wiring 100, the wiring 102, and the capacitor portion 104 shown in FIG. 2B. In FIG. 10, insulators are omitted to show a structure of the wiring 100, the wiring 102, and the capacitor portion 104 clearly.

In FIG. 10, a conductor 100a having a function of the wiring 100 has a comb-like shape in a plan view. A plurality of conductors 102a to 102j having U-shapes in a plan view is electrically connected to each other with conductors 150a to 150j provided under the conductors 102a to 102j; the conductors 102a to 102j and the conductors 150a to 150j have a function of the wiring 102.

FIG. 10 shows an example in which the conductors 102a to 102j and the conductors 150a to 150j have a function of the wiring 102 as a whole; the number of insulators necessary to function as the wiring 102 can be set as appropriate.

In FIG. 10, the conductor 100a is arranged so that its projected portions face recessed portions of the conductors 102a to 102j and mesh the recessed portions with a predetermined distance therebetween in a plan view.

Figure 11:
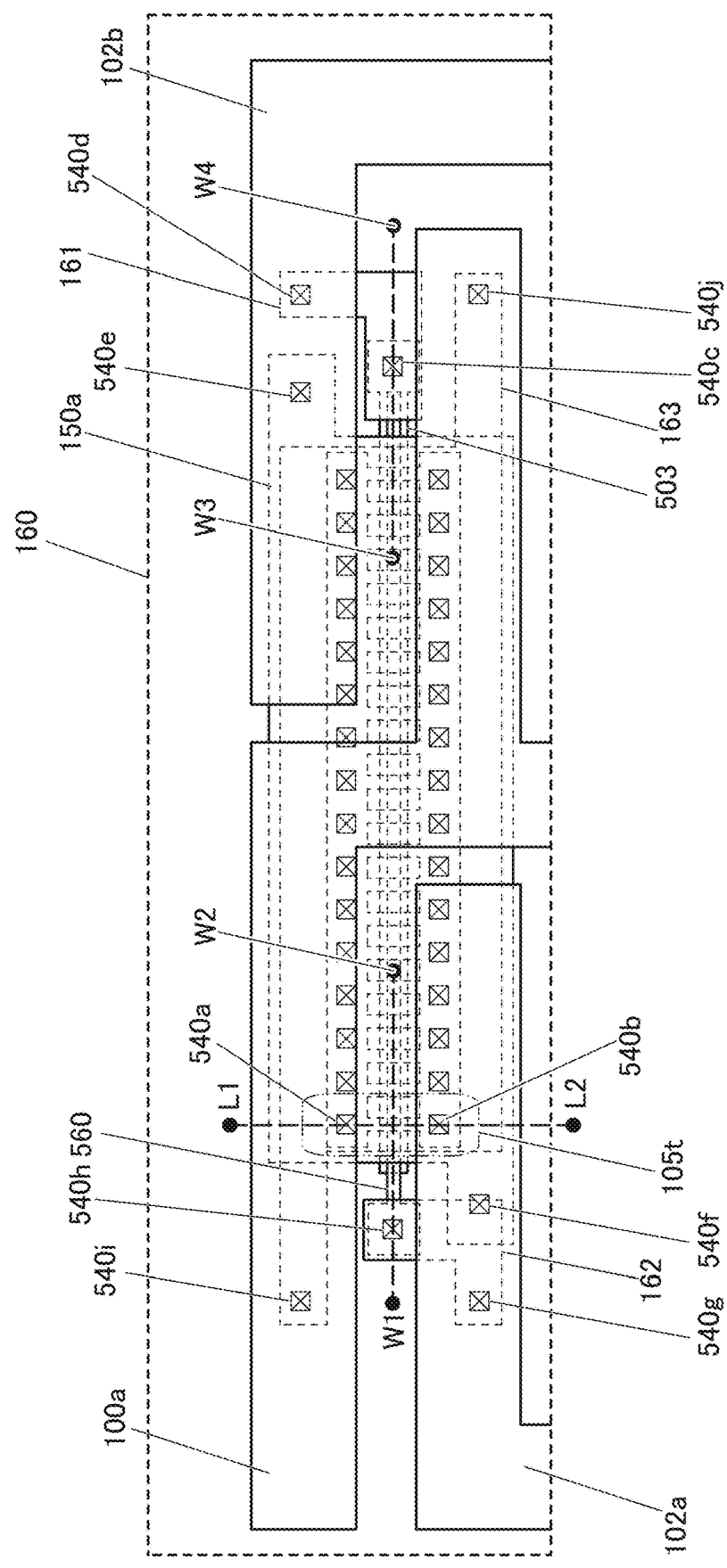
FIG. 11 is a diagram showing a configuration example of a capacitor portion in a circuit of one embodiment of the present invention.
Figure 12:
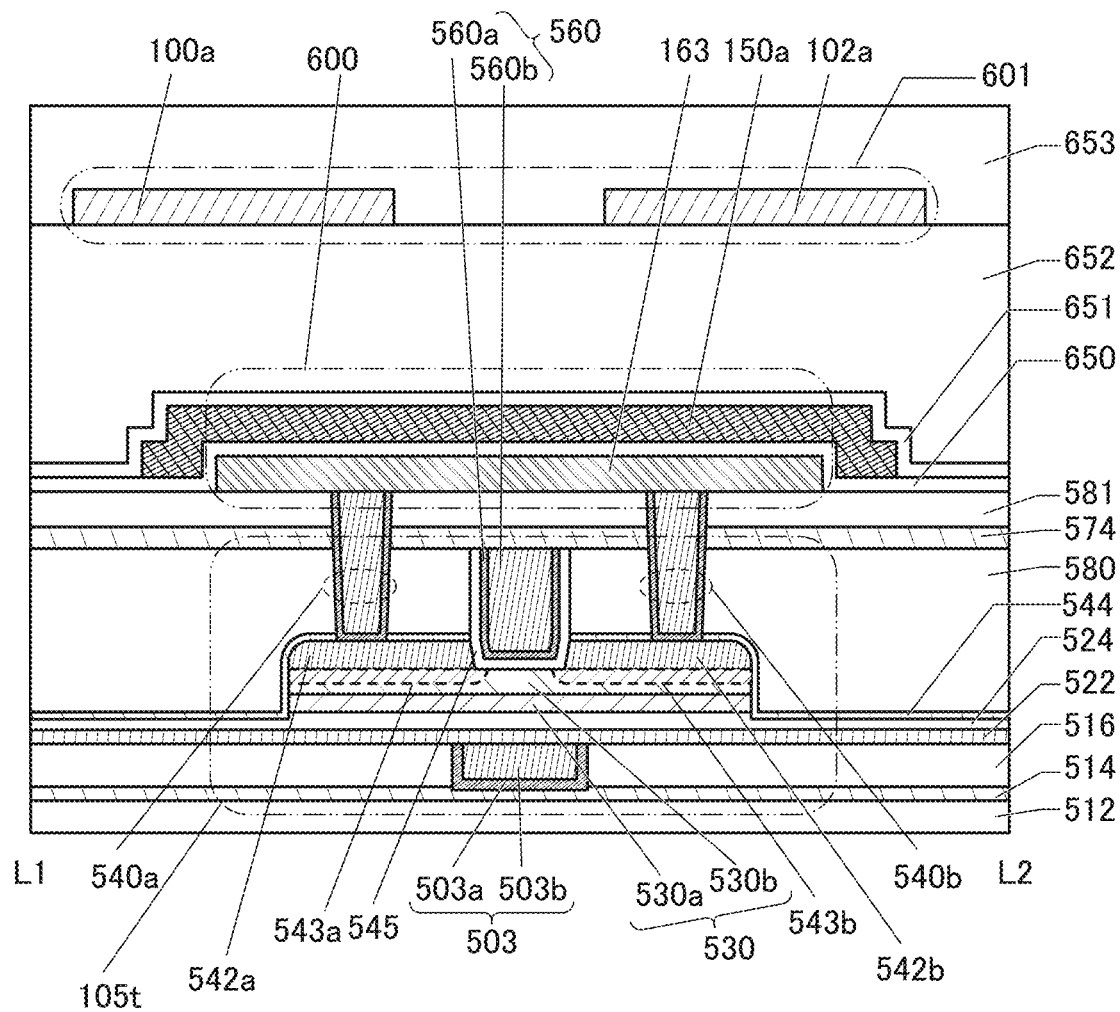
FIG. 12 is a diagram showing a structure example of a capacitor portion in a circuit of one embodiment of the present invention.
Figure 13:
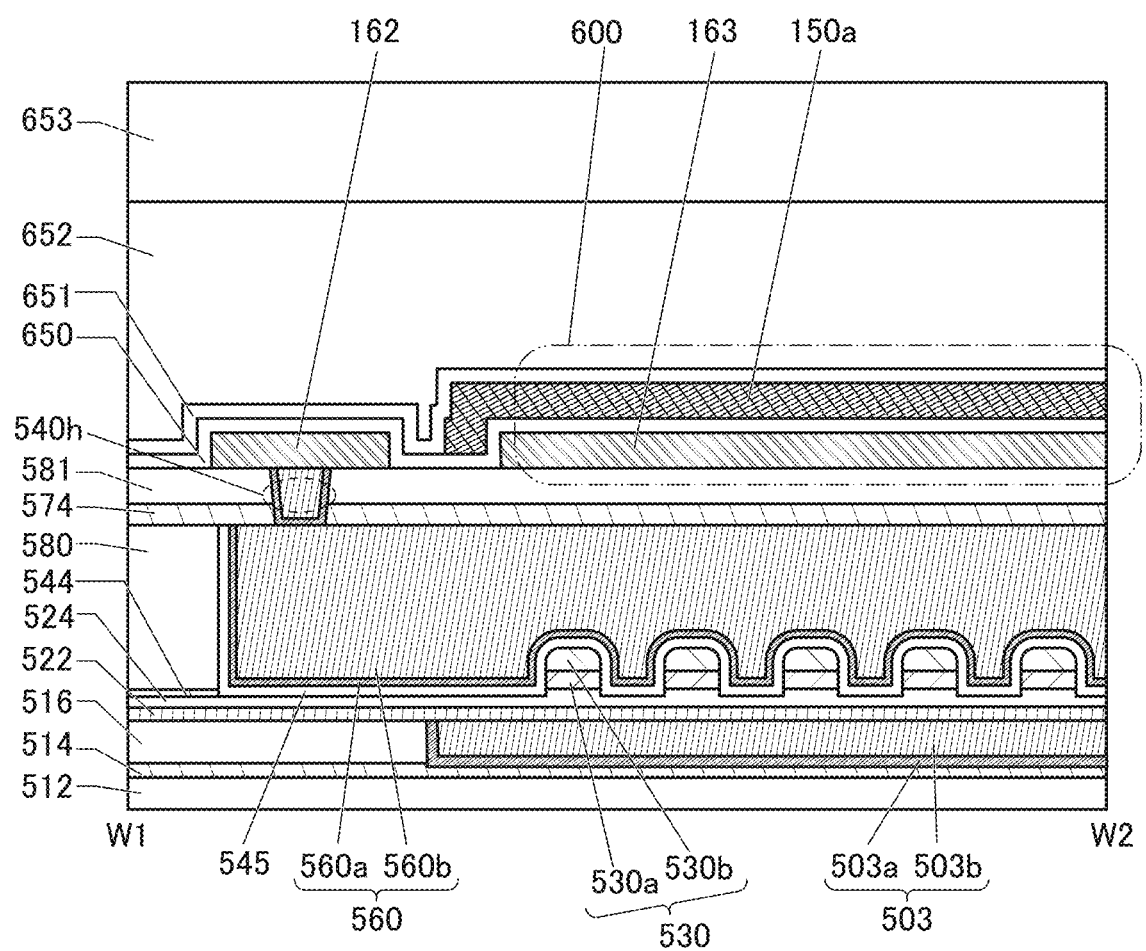
FIG. 13 is a diagram showing a structure example of a capacitor portion in a circuit of one embodiment of the present invention.
Figure 14:
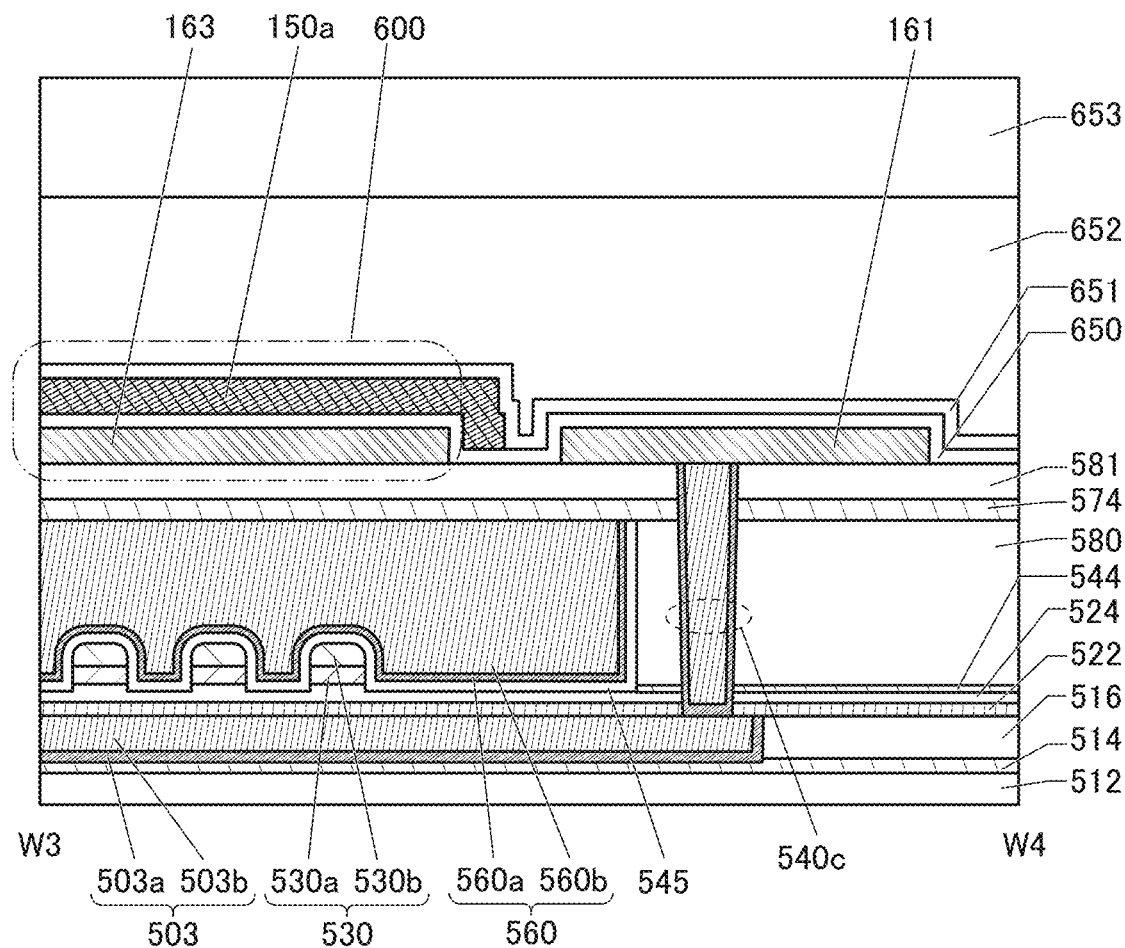
FIG. 14 is a diagram showing a structure example of a capacitor portion in a circuit of one embodiment of the present invention.

FIG. 11 shows an enlarged view of a region 160 surrounded with the dashed line in FIG. 10. FIG. 12 to FIG. 14 show cross-sectional views taken along the dashed line L1-L2, the dashed line W1-W2, and the dashed line W3-W4 in FIG. 11. A layout and a stacked-layer structure of the wiring 100, the wiring 102, and the capacitor 101 included in the circuit 10 is described below with reference to FIG. 11 to FIG. 14.

A plurality of transistors 105t is connected in parallel in a region shown in FIG. 11. Specifically, sources and drains of the plurality of transistors 105t are electrically connected to each other and front gates and back gates thereof are electrically connected to each other. The plurality of transistors 105t connected in parallel can function as one transistor 105. FIG. 11 shows an example in which the plurality of transistors 105t connected in parallel functions as one transistor 105; one transistor 105t may function as one transistor 105. In this embodiment, the structure of the circuit 10 in which the transistor 105t is an OS transistor is shown in FIG. 11 to FIG. 14.

FIG. 12 corresponds to the dashed line L1-L2 in FIG. 11 and a cross section of the transistor 105t in the channel length direction; FIG. 13 corresponds to the dashed line W1-W2 in FIG. 11 and a cross section of the transistor 105t in the channel width direction.

In the circuit 10 of one embodiment of the present invention, the insulator 512, the insulator 514, and the insulator 516 are sequentially stacked. When the transistor 105t is an OS transistor, a substance having a barrier property against oxygen or hydrogen is preferably used for any of the insulator 512, the insulator 514, and the insulator 516.

In this embodiment, a film having a barrier property that inhibits the diffusion of hydrogen or impurities is used as the insulator 514. When a film having a barrier property is used as the insulator 514, the diffusion of hydrogen or impurities from a layer under the insulator 514 to a region to which the transistor 105t is provided can be prevented.

For the film having a barrier property against hydrogen, silicon nitride formed using a CVD method can be used, for example. The diffusion of hydrogen into a semiconductor element including an oxide semiconductor, such as the transistor 105t, degrades the electric characteristics of the semiconductor element in some cases. Therefore, a film that inhibits hydrogen diffusion is preferably provided as a layer under the transistor 105t. The film that inhibits hydrogen diffusion is specifically a film from which a small amount of hydrogen is released.

As the film having a barrier property against hydrogen, a metal oxide such as aluminum oxide, hafnium oxide, or tantalum oxide is preferably used for the insulator 514, for example.

In particular, aluminum oxide has an excellent blocking effect that prevents transmission of oxygen and impurities such as hydrogen and moisture which would cause a change in the electrical characteristics of the transistor. Accordingly, aluminum oxide can prevent entry of impurities such as hydrogen and moisture into the transistor 105t in and after the manufacturing process of the transistor. In addition, release of oxygen from the oxide included in the transistor 105t can be inhibited. Therefore, aluminum oxide is suitably used for a protective film of the transistor 105t.

The insulator 512 and the insulator 516 can be formed using, for example, silicon oxide, silicon oxynitride, silicon nitride oxide, silicon nitride, aluminum oxide, aluminum oxynitride, aluminum nitride oxide, or aluminum nitride. Furthermore, when a material with a comparatively low permittivity is used for these insulators, parasitic capacitance generated between wirings can be reduced. A silicon oxide film or a silicon oxynitride film can be used for the insulator 512 and the insulator 516, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

A conductor included in the transistor 105t (a conductor 503 for example), and the like are embedded in the insulator 514 and the insulator 516. As a material for the conductor 503, a conductive material such as a metal material, an alloy material, a metal nitride material, or a metal oxide material can be used as a single layer or stacked layers. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

In particular, the conductor 503 in a region in contact with the insulator 514 is preferably a conductor having a barrier property against oxygen, hydrogen, and water. In such a structure, the transistor 105t and a region under the transistor 105t can be separated with a layer having a barrier property against oxygen, hydrogen, and water; thus, the diffusion of hydrogen from a layer under the transistor 105t into the transistor 105t can be inhibited.

The transistor 105t is provided above the insulator 516.

Specifically, the transistor 105t includes the conductor 503 positioned to be embedded in the insulator 514 and the insulator 516; an insulator 522 positioned over the insulator 516 and the conductor 503; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

An insulator 544 is preferably provided between the insulator 580 and the oxide 530a, the oxide 530b, the conductor 542a, and the conductor 542b. The conductor 560 preferably includes a conductor 560a provided on the inner side of the insulator 545 and a conductor 560b provided to be embedded on the inner side of the conductor 560a. An insulator 574 is preferably provided over the insulator 580, the conductor 560, and the insulator 545.

Note that although a structure of the transistor 105t in which two layers of the oxide 530a and the oxide 530b are stacked in a region where a channel is formed and its vicinity is shown, the present invention is not limited thereto. For example, it is possible to employ a structure in which a single layer of the oxide 530b or a stacked-layer structure of three or more layers is provided.

Furthermore, although the conductor 560 is shown to have a stacked-layer structure of two layers in the transistor 105t, the present invention is not limited thereto. For example, the conductor 560 may have a single-layer structure or a stacked-layer structure of three or more layers.

Accordingly, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 105t, the gate electrode can be positioned between the source electrode and the drain electrode in a self-aligned manner. Thus, the conductor 560 can be formed without an alignment margin, resulting in a reduction in the area occupied by the transistor 105t. Accordingly, miniaturization and high integration of the circuit 10 and the semiconductor device including the circuit 10 can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and the conductor 542a and the conductor 542b can be reduced.

The conductor 560 sometimes functions as a first gate (also referred to as front gate) electrode. The conductor 503 functions as a second gate (also referred to as back gate) electrode in some cases. In one embodiment of the present invention, the front gate and the back gate of the transistor 105t are electrically connected to each other and the front gate and the back gate are electrically connected to a conductor 102a and a conductor 102b, which function as the wiring 102. Specifically, as shown in FIG. 11, the conductor 503 is electrically connected to a conductor 161 through a conductor 540c, and the conductor 161 is electrically connected to the conductor 102b through a conductor 540d. The conductor 102b is electrically connected to the conductor 150a through a conductor 540e, and the conductor 150a is electrically connected to the conductor 102a through a conductor 540f. The conductor 102a is electrically connected to a conductor 162 through a conductor 540g, and the conductor 162 is electrically connected to a conductor 540h through the conductor 560a.

The conductor 542a and the conductor 542b each function as a source electrode and a drain electrode. In one embodiment of the present invention, the source electrode and the drain electrode of the transistor 105t are electrically connected to each other, and the source electrode and the drain electrode are also electrically connected to the conductor 100a which functions as the wiring 100. Specifically, as shown in FIG. 11 and FIG. 12, the conductor 542a is electrically connected to the conductor 163 through the conductor 540a, and the conductor 542b is electrically connected to the conductor 163 through the conductor 540b. The conductor 163 is electrically connected to the conductor 100a through a conductor 540i, and the conductor 163 is electrically connected to the conductor 100a through a conductor 540j.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered with the connected electric field.

In this specification and the like, a transistor structure in which a channel formation region is electrically surrounded with electric fields of a pair of gate electrodes (first gate electrode and second gate electrode) is referred to as a surrounded channel (S-channel) structure. In one embodiment of the present invention, the capacitance value per area in a plan view of the capacitor 101 including the transistor 105t can be increased due to the surrounded channel (S-channel) structure. In particular, by adding the structure of a pair of gate electrodes electrically connected to each other to the above structure, the capacitance value per area in a plan view can be further increased.

In addition, the conductor 503 has a structure similar to that of FIG. 4 and FIG. 5; a conductor 503a is formed in contact with an inner wall of a recessed portion formed with an opening in the insulator 514 and the insulator 516, and a conductor 503b is formed on the inner side. Note that although the transistor 105t having a structure in which the conductor 503a and the conductor 503b are stacked is shown, the present invention is not limited thereto. For example, the conductor 503 may have a single-layer structure or a stacked-layer structure of three or more layers.

For the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of oxygen atoms, oxygen molecules, and the like) (the above oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b.

The insulator 522 and the insulator 524 have a function of a second gate insulating film.

As the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 524. When such an insulator containing excess oxygen is provided in contact with the oxide 530, oxygen vacancies ($V_O$) in the oxide 530 can be reduced and the reliability of the transistor 105t can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_O H$ is sufficiently reduced. When an oxide semiconductor with sufficiently reduced impurities such as $V_O H$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$, or still further preferably greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. Through the treatment, water or hydrogen in the oxide 530 can be removed. For example, in the oxide 530, dehydrogenation can be performed when a reaction in which a bond of $V_O H$ is cut occurs, i.e., a reaction of $V_O H \rightarrow V_O + H$ occurs. Part of hydrogen generated at this time is bonded to oxygen to be $H_2O$, and removed from the oxide 530 or an insulator near the oxide 530 in some cases. Part of hydrogen is sometimes gettered by the conductor 542a and the conductor 542b.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30% for the microwave treatment.

In a manufacturing process of the transistor 105t, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O + O \rightarrow null$. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_O H$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused to the insulator 516 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 105t into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 524 be thermally stable. For example, silicon oxide and silicon oxynitride, which have thermal stability, are suitable. Furthermore, the combination of an insulator that is a high-k material and silicon oxide or silicon oxynitride enables the insulator 524 to have a stacked-layer structure that has thermal stability and a high relative permittivity.

This embodiment shows an example of the transistor 105t including a second gate insulating film having a stacked-layer structure of two layers of the insulator 522 and the insulator 524; the second gate insulating film may have a stacked-layer structure with a single layer, three layers, or four or more layers. In such cases, without limitation to a stacked-layer structure formed of the same material, a stacked-layer structure formed of different materials may be employed.

In the transistor 105t, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed using a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap that is preferably 2 eV or higher, further preferably 2.5 eV or higher. With use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion between the oxide 530a and the oxide 530b. In other words, the energy level of the conduction band minimum at the junction portion between the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b include the same element as a main component in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above structure, the density of defect states at the interface between the oxide 530a and the oxide 530b can be made low.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In this embodiment, although the conductor 542a and the conductor 542b each having a single-layer structure are shown, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In this embodiment, a region 543a and a region 543b are sometimes formed as low-resistance regions in the oxide 530 at and around the interface with the conductor 542a (or conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (or conductor 542b) is provided to be in contact with the oxide 530, the oxygen concentration in the region 543a (or region 543b) sometimes decreases. In addition, a metal compound layer that contains the metal contained in the conductor 542a (or conductor 542b) and the component of the oxide 530 is sometimes formed in the region 543a (or region 543b). In such a case, the carrier density of the region 543a (or region 543b) increases, and the region 543a (or region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high relative permittivity.

Although the conductor 560 that functions as the first gate electrode and has a two-layer structure is shown in this embodiment, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560a is formed using a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening in the insulator 580 and the region sandwiched between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is formed using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited using a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween.

The conductor 540c is provided in an opening formed in the insulator 581, the insulator 574, the insulator 580, the insulator 544, the insulator 524, and the insulator 522. The conductor 540h is provided in an opening formed in the insulator 581 and the insulator 574.

The conductor 161, the conductor 162, and the conductor 163 are provided over the insulator 581. An insulator 650 is provided over the insulator 581, the conductor 161, the conductor 162, and the conductor 163. The conductor 150a is provided over the insulator 650, and an insulator 651 and an insulator 652 are provided over the insulator 650 and the conductor 150a. For the insulator 650, the insulator 651, and the insulator 652, silicon oxide, silicon oxynitride, silicon nitride oxide, silicon nitride, aluminum oxide, aluminum oxynitride, aluminum nitride oxide, aluminum nitride, or the like is used, for example. Furthermore, when a material with a comparatively low permittivity is used for these insulators, parasitic capacitance generated between wirings can be reduced. A silicon oxide film or a silicon oxynitride film can be used for the insulator 650, the insulator 651, and the insulator 652, for example. The insulator 652 may function as a planarization film that covers an uneven shape thereunder.

As shown in FIG. 11 and FIG. 12, the conductor 100a, the conductor 102a, and the conductor 102b are provided over the insulator 652. An insulator 653 is provided over the conductor 100a, the conductor 102a, and the conductor 102b. As the insulator 653, an insulator used as the insulator 650, the insulator 651, or the insulator 652 is used.

The conductor 150a and the conductor 163 have regions overlapping with each other with the insulator 650 therebetween in a cross-sectional view, and these regions function as a capacitor 600. The conductor 150a is electrically connected to the conductor 102a and the conductor 102b that function as the wiring 102, and the conductor 163 is electrically connected to the conductor 100a that functions as the wiring 100. Thus, one electrode of the capacitor 600 is electrically connected to the wiring 100, and the other electrode thereof is electrically connected to the wiring 102.

As shown in FIG. 11 and FIG. 12, the conductor 100a and the conductor 102a each have a region facing each other with the insulator 653 therebetween in a plan view, and the conductor 100a and the conductor 102b each have a region facing each other with the insulator 653 therebetween in a plan view; the regions have a function of the capacitor 601. The conductor 100a functions as the wiring 100, and the conductor 102a and the conductor 102b function as the wiring 102. Thus, one electrode of the capacitor 601 is electrically connected to the wiring 100, and the other electrode of the capacitor 601 is electrically connected to the wiring 102.

In the transistor 105, the conductor 560 functioning as the front gate and the conductor 503 functioning as the back gate are electrically connected to the conductor 150a, and the conductor 542a and the conductor 542b that function as the source electrode and the drain electrode are electrically connected to the conductor 163. Thus, the capacitor 101a which corresponds to a capacitor formed between the source and the drain and the front gate and the back gate of the transistor 105 can be regarded as having one electrode electrically connected to the wiring 100 and the other electrode electrically connected to the wiring 102. Thus, in the semiconductor device in this embodiment, each of the capacitor 600, the capacitor 601, and the capacitor 101a is electrically connected to the wiring 100 and the wiring 102; thus, noise components supplied to the wiring 100 can be removed with these capacitors. The transistor 105 included in the capacitor 101a, the capacitor 600, and the capacitor 601 are stacked in this order and include regions overlapping with each other. Accordingly, in one embodiment of the present invention, malfunctions of the circuit 10 or a semiconductor device including the circuit 10 can be prevented and the layout area of the circuit in a plan view, or the size of the semiconductor device including the circuit can be reduced.

For the conductor 161, the conductor 162, the conductor 163, the conductor 150a, the conductor 100a, the conductor 102a, and the conductor 102b, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

In this embodiment, the conductor 161, the conductor 162, the conductor 163, the conductor 150a, the conductor 100a, the conductor 102a, and the conductor 102b each have a single layer; not limited to the structures, each of them can have a stacked-layer structure of two layers or more. For example, between a conductor having a barrier property and a conductor having high conductivity, a conductor that is highly adhesive to the conductor having a barrier property and the conductor having high conductivity may be formed.

For example, in this embodiment, a tungsten film is used as the conductor 161, the conductor 162, the conductor 163, and the conductor 150a. In this embodiment, for example, a titanium film, a titanium nitride film, an aluminum film, a titanium film, and a titanium nitride film are sequentially stacked to be used as the conductor 100a, the conductor 102a, and the conductor 102b.

The conductor 540d, the conductor 540g, the conductor 540i, and the conductor 540j are provided in openings formed in the insulator 652, the insulator 651, and the insulator 650. The conductor 540e and the conductor 540f are provided in openings formed in the insulator 652 and the insulator 651.

After the transistor 105t is formed, an opening may be formed to surround the transistor 105t and an insulator having a high barrier property against hydrogen or water may be formed to cover the opening. Surrounding the transistor 105t with the insulator having a high barrier property can prevent entry of moisture and hydrogen from the outside. Alternatively, a plurality of transistors 105t may be collectively surrounded with the insulator having a high barrier property against hydrogen or water. When an opening is formed to surround the transistor 105t, for example, the formation of an opening reaching the insulator 522 or the insulator 514 and the formation of the insulator having a high barrier property in contact with the insulator 522 or the insulator 514 are suitable because some of the manufacturing steps of the transistor 105t can be omitted. The insulator having a high barrier property against hydrogen or water is formed using a material similar to that for the insulator 522 or the insulator 514, for example.

With use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, paper, and the like. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

This embodiment can be implemented in appropriate combination with the other embodiments.

Embodiment 4

In this embodiment, an example of a structure of a transistor that can be used in the transistor 105 in the semiconductor device, the load 103, and the like described in the above embodiment will be described. As an example, a configuration in which transistors having different electrical characteristics are stacked is described. With the structure, the degree of freedom in design of the semiconductor device can be increased. Stacking transistors having different electrical characteristics can increase the degree of integration of the semiconductor device.

Figure 15:
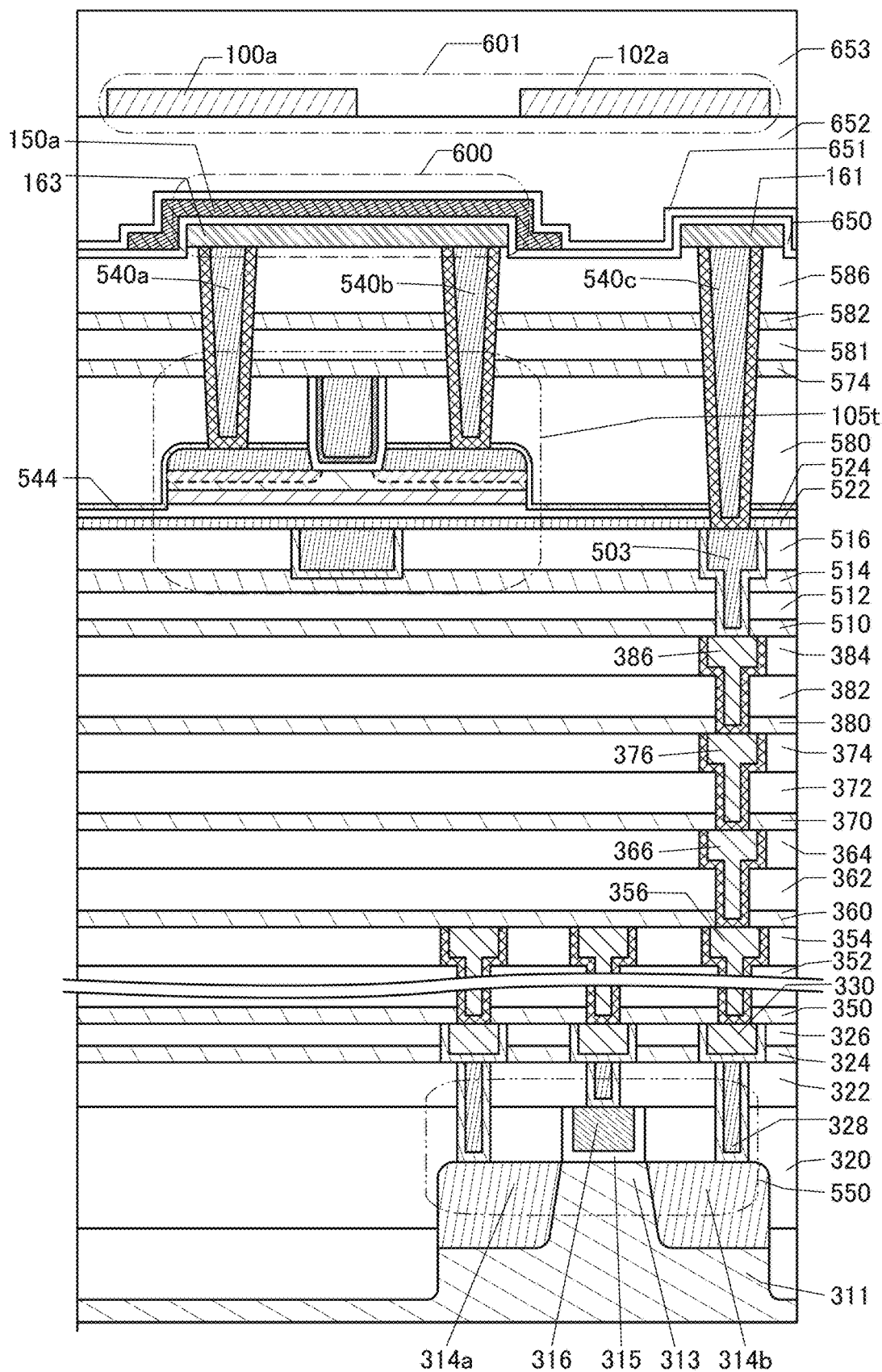
FIG. 15 is a diagram showing a structure example of a semiconductor device of one embodiment of the present invention.

FIG. 15 shows part of a cross-sectional structure of a semiconductor device. A semiconductor device in FIG. 15 includes the transistor 550 and the transistor 105t. FIG. 15 shows the transistor 105t shown in FIG. 12; the transistor 105 shown in FIG. 4 and FIG. 5 can be used. For components in FIG. 15 with the same reference numerals shown in FIG. 10 to FIG. 14, descriptions in Embodiment 3 can be referred to.

The transistor 105t is provided above the transistor 550 in FIG. 15.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region.

FIG. 15 shows a cross-sectional view of the transistor 550 in the channel length direction; in the channel-width direction, a top surface of the semiconductor region 313 and side surfaces thereof are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using a silicon on insulator (SOI) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing; or an SOI substrate formed by using a Smart-Cut method in which a semiconductor substrate is cleaved by utilizing growth of a minute void, which is formed by implantation of a hydrogen ion, due to thermal treatment, by using an ELTRAN method (a registered trademark: Epitaxial Layer Transfer), or the like. A transistor formed using a single crystal substrate contains a single crystal semiconductor in a channel formation region.

The transistor 550 shown in FIG. 15 is an example and the configuration is not limited thereto; an appropriate transistor can be used in accordance with a circuit configuration or a driving method. For example, a transistor which is used in the load 103 can be an OS transistor having the same structure as the transistor 105t. In that case, the front gate and the back gate of the transistor need not be electrically connected to each other, and the source and the drain of the transistor need not be electrically connected to the back gate. A connection relation between the electrodes of the transistor used for the load 103 may be determined as appropriate in accordance with the configuration of a circuit used for the load 103.

In FIG. 15, an insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 105t is provided.

For the film having a barrier property against hydrogen, silicon nitride formed using a CVD method can be used, for example. Here, diffusion of hydrogen to a semiconductor element including an oxide semiconductor, such as the transistor 105t, degrades the characteristics of the semiconductor element in some cases. Therefore, a film that inhibits hydrogen diffusion is preferably provided between the transistor 105t and the transistor 550. The film that inhibits hydrogen diffusion is specifically a film from which a small amount of hydrogen is released.

The amount of released hydrogen can be analyzed using thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the conductor 503 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted with the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 15, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is preferably formed in an opening portion of the insulator 350 having a barrier property against hydrogen. With this structure, the transistor 550 and the transistor 105$t$ can be separated with a barrier layer, so that diffusion of hydrogen from the transistor 550 into the transistor 105$t$ can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a configuration in which a tantalum nitride layer having a barrier property against hydrogen is in contact with the insulator 350 having a barrier property against hydrogen is preferable.

A wiring layer may be provided over the insulator 354 and the conductor 356. For example, in FIG. 15, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is preferably formed in an opening portion of the insulator 360 having a barrier property against hydrogen. With this structure, the transistor 550 and the transistor 105$t$ can be separated with a barrier layer, so that diffusion of hydrogen from the transistor 550 into the transistor 105$t$ can be inhibited.

A wiring layer may be provided over the insulator 364 and the conductor 366. For example, in FIG. 15, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is preferably formed in an opening portion of the insulator 370 having a barrier property against hydrogen. With this structure, the transistor 550 and the transistor 105$t$ can be separated with a barrier layer, so that diffusion of hydrogen from the transistor 550 into the transistor 105$t$ can be inhibited.

A wiring layer may be provided over the insulator 374 and the conductor 376. For example, in FIG. 15, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is preferably formed in an opening portion of the insulator 380 having a barrier property against hydrogen. With this structure, the transistor 550 and the transistor 105$t$ can be separated with a barrier layer, so that diffusion of hydrogen from the transistor 550 into the transistor 105$t$ can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 550 is provided, or the like into the region where the transistor 105$t$ is provided. Therefore, a material similar to that for the insulator 324 can be used.

For the film having a barrier property against hydrogen, silicon nitride formed using a CVD method can be used, for example. Here, diffusion of hydrogen to a semiconductor element including an oxide semiconductor, such as the transistor 105$t$, degrades the characteristics of the semiconductor element in some cases. Therefore, a film that inhibits hydrogen diffusion is preferably provided between the transistor 105$t$ and the transistor 550. The film that inhibits hydrogen diffusion is specifically a film from which a small amount of hydrogen is released.

As the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents transmission of oxygen and impurities such as hydrogen and moisture which would cause a change in the electrical characteristics of the transistor. Accordingly, aluminum oxide can prevent entry of impurities such as hydrogen and moisture into the transistor 105t in and after the manufacturing process of the transistor. In addition, release of oxygen from the oxide included in the transistor 105t can be inhibited. Therefore, aluminum oxide is suitably used for a protective film of the transistor 105t.

In FIG. 15, the conductor 503 and the like functioning as the back gate of the transistor 105t are embedded in the insulator 510, the insulator 512, the insulator 514, and the insulator 516. FIG. 15 shows an example in which the conductor 503 is electrically connected to the conductor 328 through the conductor 386, the conductor 376, the conductor 366, the conductor 356, and the conductor 330.

FIG. 15 shows an example in which an insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, aluminum oxide can prevent entry of impurities such as hydrogen and moisture into the transistor 105t in and after the manufacturing process of the transistor. In addition, release of oxygen from the oxide included in the transistor 105t can be inhibited. Therefore, aluminum oxide is suitably used for a protective film of the transistor 105t.

In addition, in FIG. 15, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

In FIG. 15, the conductor 540a, the conductor 540b, the conductor 540c, and the like are embedded in the insulator 522, the insulator 524, the insulator 544, the insulator 580, the insulator 574, the insulator 581, the insulator 582, and the insulator 586.

The conductor 540a and the conductor 540b have a function of a plug or a wiring that is connected to the conductor 163. The conductor 540c has a function of a plug or a wiring that is connected to the conductor 161. The conductor 540a, the conductor 540b, and the conductor 540c can be provided using a material similar to those for the conductor 328 and the conductor 330.

After the transistor 105t is formed, an opening may be formed to surround the transistor 105t and an insulator having a high barrier property against hydrogen or water may be formed to cover the opening. Surrounding the transistor 105t with the insulator having a high barrier property can prevent entry of moisture and hydrogen from the outside. Alternatively, a plurality of transistors 105t may be collectively surrounded with the insulator having a high barrier property against hydrogen or water. When an opening is formed to surround the transistor 105t, for example, the formation of an opening reaching the insulator 522 or the insulator 514 and the formation of the insulator having a high barrier property in contact with the insulator 522 or the insulator 514 are suitable because some of the manufacturing steps of the transistor 105t can be omitted. The insulator having a high barrier property against hydrogen or water is formed using a material similar to that for the insulator 522 or the insulator 514, for example.

Next, the conductor 161 and the conductor 163 are provided over the transistor 105t. The insulator 650 is provided over the conductor 161 and the conductor 163, and the conductor 150a is provided over the insulator 650.

With use of this structure, a semiconductor device using a transistor including an oxide semiconductor can be miniaturized or highly integrated.

This embodiment can be implemented in appropriate combination with the other embodiments.

Embodiment 5

In this embodiment, a measurement result of a capacitance value between the gate and the source and the drain of an OS transistor (hereinafter Cgsd) with respect to a voltage between the gate and the source (hereinafter gate voltage Vgs), and a simulation result of a capacitance value of a Si transistor with respect to the gate voltage Vgs are described.

Figure 16A:
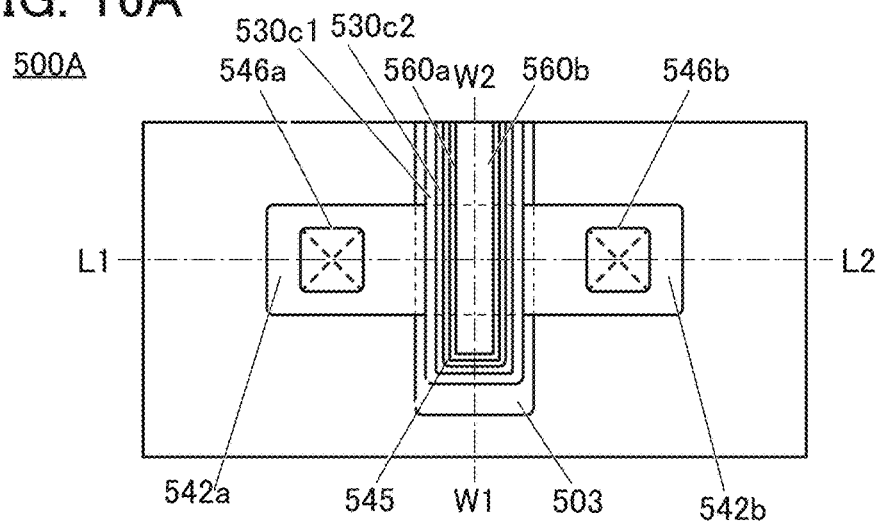
FIG. 16A to FIG. 16C are diagrams showing a structure of an OS transistor used for a simulation.
Figure 16B:
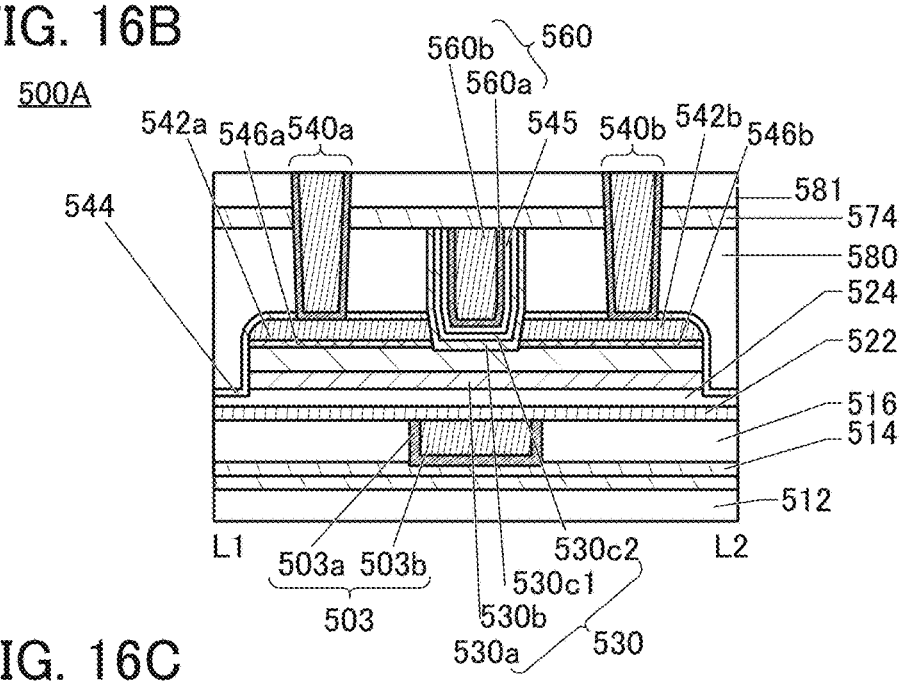
Figure 16C:
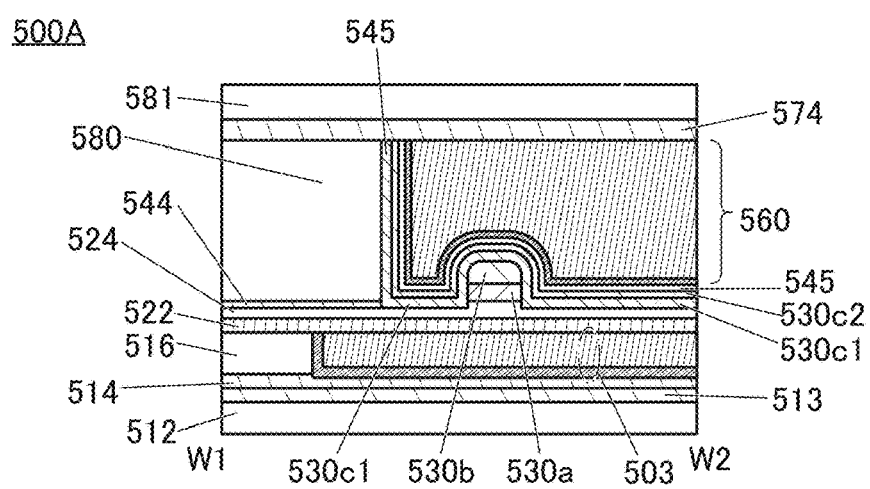

FIG. 16 shows an OS transistor 500A used for the measurement. FIG. 16A corresponds to a top view of the OS transistor 500A, and FIG. 16B is a cross-sectional view taken along the dashed line L1-L2 in FIG. 16A and corresponds to a cross-sectional view of the transistor 500A in the channel length direction. FIG. 16C is a cross-sectional view taken along the dashed line W1-W2 in FIG. 16A and corresponds to a cross-sectional view of the transistor 500A in the channel width direction.

The transistor 105 in FIG. 12 can be referred to for components of the OS transistor 500A. A capacitance value of one OS transistor 500A shown in FIG. 16 was measured in this embodiment although FIG. 12 shows a plurality of transistors 105 connected in parallel. For the components in FIG. 16 denoted with the same reference numerals as those in FIG. 10 to FIG. 14, descriptions of Embodiment 3 can be referred to.

Differences of the OS transistor 500A in FIG. 16 from the transistor 105 in FIG. 12 are described. The OS transistor 500A in FIG. 16 includes an oxide 546a between the oxide 530b and the conductor 542a, and an oxide 546b between the oxide 530b and the conductor 542b. The OS transistor 500A shown in FIG. 16 includes an oxide 530c1 and an oxide 530c2 stacked in this order between the insulator 545 and a side surface and a bottom surface of an opening of the insulator 580.

The structures of conductors and insulators in the OS transistor 500A are shown in Table 1 below.

TABLE 1

OS transistor 500

Channel length 60 nm
Channel width 60 nm

| Structure | Material | Thickness (nm) |
|---|---|---|
| Conductor 503a | TiN | 20 |
| Conductor 503b | W | 250 |
| Conductor 560a | TiN | 5 |
| Conductor 560b | W | 250 |
| Conductor 542a | TaNx | 25 |
| Conductor 542b | TaNx | 25 |
| Insulator 522 | HfOx | 20 |
| Insulator 524 | SiON | 30 |
| Insulator 545 | SiON | 6 |
| Oxide 530a | IGZO (1:3:4) | 5 |
| Oxide 530b | IGZO (4:2:3) | 15 |
| Oxide 543a | IGZO | 2 |
| Oxide 543b | (1:3:4) | |
| Oxide 530c1 | IGZO (4:2:3) | 3 |
| Oxide 530c2 | IGZO (1:3:4) | 3 |

A source and a drain of the OS transistor 500A were connected to each other, and a front gate and a back gate thereof were connected to each other.

Cgsd of a Si transistor was calculated with SmartSpice manufactured by SILVACO, Inc. The Si transistor had a single-gate structure including one gate electrode; the channel length was 60 nm and the channel width was 80 nm. It was assumed that the Si transistor had a structure in which its source and drain were connected to each other and its gate was connected to the body.

Figure 17:
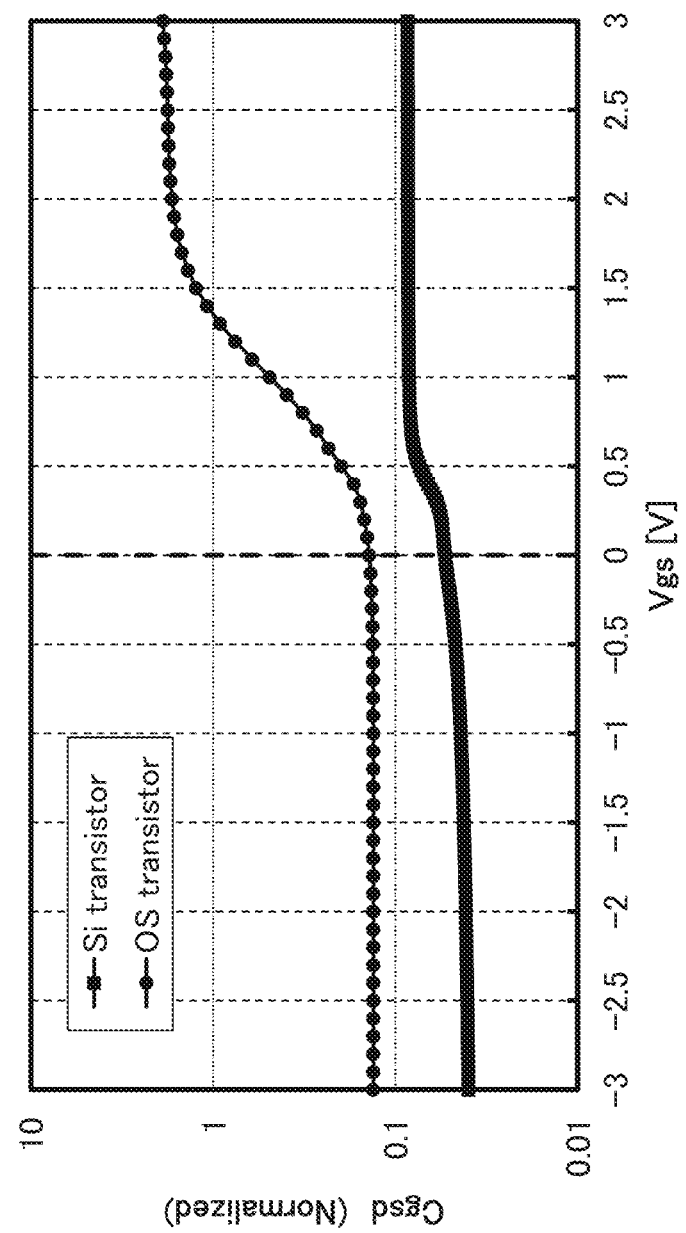
FIG. 17 is a graph showing the simulation results.

FIG. 17 shows the values of Cgsd of the OS transistor 500A and the Si transistor when the gate voltage Vgs was changed. The values of Cgsd were normalized in the channel length and the channel width.

FIG. 17 shows that the Si transistor had a larger Cgsd value than the OS transistor 500A. It was found that the OS transistor 500A had a larger difference between the Cgsd value with Vgs under a threshold voltage and the Cgsd value with Vgs over a threshold voltage than the Si transistor. Accordingly, when the transistor 500A is used as the capacitor 101a and a structure is employed in which the capacitor portion 104 includes the transistor 105a and the transistor 105b shown in FIG. 3A and FIG. 3B, a change of the capacitance value of the combined capacitance of the entire capacitor portion 104 can be prevented although the power supply potential of the wiring 100 changes, and the capacitance value per area in a plan view of the capacitor 101 can be increased. By preventing a change of the capacitance value of the combined capacitance of the entire capacitor portion 104, malfunctions of the circuit 10 and a semiconductor device due to noise components can be inhibited although the power supply potential of the wiring 100 changes. By increasing the capacitance value per area in a plan view of the capacitor 101, the increase in the layout area of the circuit 10 can be prevented and the size of a semiconductor device including the circuit 10 can be reduced.

This embodiment can be implemented in appropriate combination with the other embodiments.

Embodiment 6

In this embodiment, an oxide semiconductor which is a kind of metal oxides will be described.

The metal oxide preferably contains at least indium or zinc. In particular, indium and zinc are preferably contained. Furthermore, aluminum, gallium, yttrium, tin, or the like is preferably contained in addition to indium and zinc. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classifications of the crystal structures of an oxide semiconductor are described with reference to FIG. 18A. FIG. 18A is a diagram showing classifications of crystal structures of an oxide semiconductor, typically IGZO (a metal oxide containing In, Ga, and Zn).

As shown in FIG. 18A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 18A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 18B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 18B and obtained using GIXD measurement is hereinafter simply referred to as an XRD spectrum. The CAAC-IGZO film in FIG. 18B has a composition in the neighborhood of In:Ga:Zn=4:2:3 [atomic ratio]. The CAAC-IGZO film in FIG. 18B has a thickness of 500 nm.

As shown in FIG. 18B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 18B, the peak at 2θ of around 31° is asymmetric with respect to the axis of the angle at which the peak intensity is detected.

A crystal structure of a film or a substrate can also be evaluated with a diffraction pattern obtained using a nanobeam electron diffraction (NBED) method (such a pattern is also referred to as a nanobeam electron diffraction pattern). FIG. 18C shows a diffraction pattern of the CAAC-IGZO film. FIG. 18C shows a diffraction pattern obtained with the NBED method in which an electron beam is incident in the direction parallel to the substrate. The composition of the CAAC-IGZO film in FIG. 18C is In:Ga:Zn=4:2:3 [atomic ratio] or the neighborhood thereof. In the nanobeam electron diffraction method, electron diffraction is performed with a probe diameter of 1 nm.

As shown in FIG. 18C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 18A when classified in terms of the crystal structure. Oxide semiconductors are classified into a single crystal oxide semiconductor and a non-singlecrystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of λ0) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor using some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. A material structure of the CAC-OS is described.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and fast switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm', still further preferably lower than or equal to $1 \times 10^{11}$ cm', yet further preferably lower than $1 \times 10^{10}$ cm$^{3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described above in this embodiment can be used in combination as appropriate with the compositions, structures, methods, and the like described in the other embodiments, the example, and the like.

Embodiment 7

In this embodiment, application examples of the above described semiconductor device are described.

[Semiconductor Wafer, Chip]

Figure 19A:
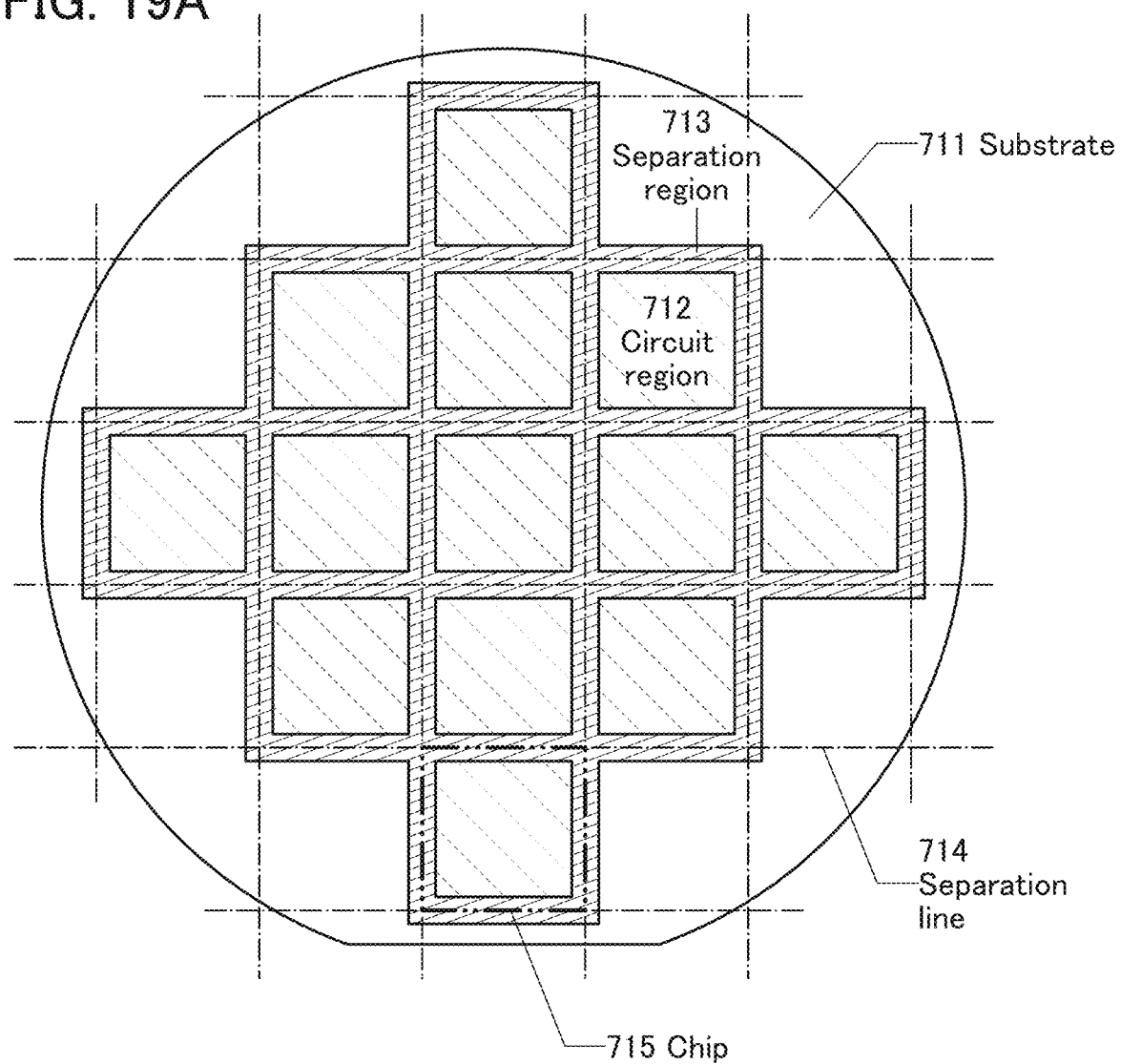
FIG. 19A is a top view of a semiconductor wafer.

FIG. 19A is a top view of a substrate 711 before dicing treatment is performed. As the substrate 711, a semiconductor substrate (also referred to as a "semiconductor wafer") can be used, for example. A plurality of circuit regions 712 are provided over the substrate 711. A semiconductor device, a CPU, an RF tag, an image sensor, or the like of one embodiment of the present invention can be provided in the circuit region 712.

Figure 19B:
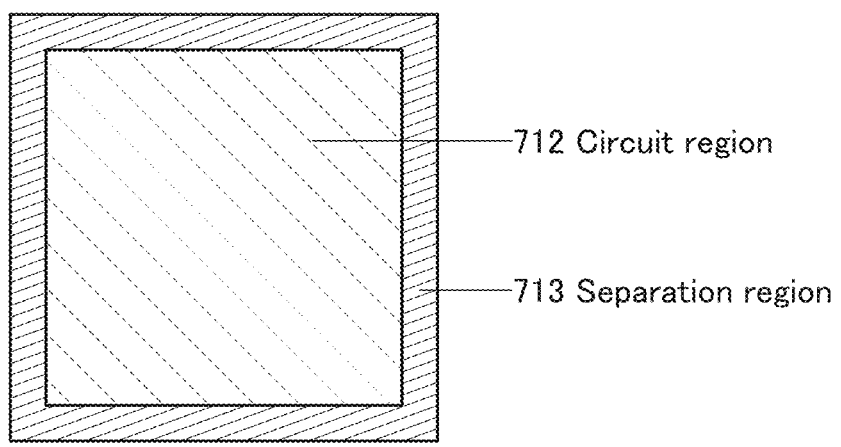
FIG. 19B is an enlarged view of a chip.

The plurality of circuit regions 712 are each surrounded with a separation region 713. Separation lines (also referred to as "dicing lines") 714 are set at a position overlapping with the separation regions 713. The substrate 711 is cut along the separation lines 714, whereby chips 715 including the circuit regions 712 can be cut out from the substrate 711. FIG. 19B shows an enlarged view of the chip 715.

Furthermore, a conductive layer or a semiconductor layer may be provided in the separation regions 713. Providing a conductive layer or a semiconductor layer in the separation regions 713 relieves ESD that might be caused in a dicing step, preventing a decrease in the yield in the dicing step. Furthermore, a dicing step is generally performed while letting pure water whose specific resistance is decreased by the inclusion of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the manufacturing cost of the semiconductor device can be reduced. Furthermore, the productivity of the semiconductor device can be increased.

For a semiconductor layer provided in the separation regions 713, it is preferable to use a material having a bandgap larger than or equal to 2.5 eV and smaller than or equal to 4.2 eV, preferably larger than or equal to 2.7 eV and smaller than or equal to 3.5 eV. The use of such a material allows accumulated charge to be released slowly; thus, rapid move of charge due to ESD can be suppressed and electrostatic breakdown is less likely to occur.

[Electronic Component]

FIG. 20 shows an example where the chip 715 is used for an electronic component. Note that the electronic component is also referred to as a semiconductor package or an IC package. For electronic components, there are various standards and names corresponding to a terminal extraction direction and a terminal shape.

The electronic component is completed when the semiconductor device described in the above embodiment is combined with components other than the semiconductor device in an assembly process (post-process).

Figure 20A:
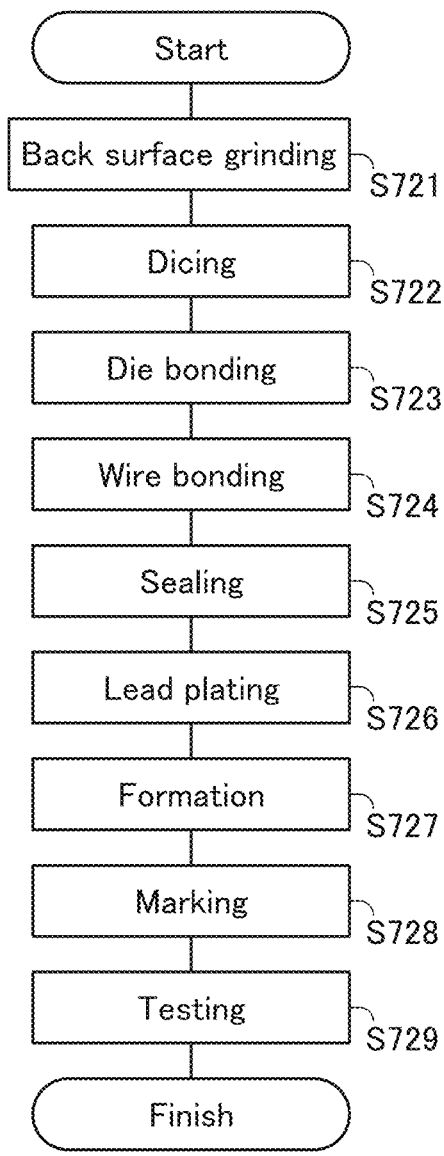
FIG. 20A is a flow chart showing an example of a manufacturing process of an electronic component.

The post-process is described with reference to a flow chart shown in FIG. 20A. After an element substrate including the semiconductor device described in any of the above embodiments is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, resulting in the reduction in size of the electronic component.

Next, a "dicing step" for dividing the element substrate into a plurality of chips (chip 715) is performed (Step S722). Then, a "die bonding step" is performed to pick up the divided chips separately and bond them to a lead frame (Step S723). To bond a chip and a lead frame in the die bonding step, resin bonding, tape-automated bonding, or the like is selected as determined as appropriate for products. Note that the chip may be bonded to an interposer substrate instead of the lead frame.

Next, a "wire bonding step" for electrically connecting a lead of the lead frame and an electrode on the chip through a metal wire is performed (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" for plating the lead of the lead frame is performed (Step S726). This plating treatment prevents rust of the lead, and soldering at the time of mounting the electronic component on a printed board in a later step can be performed with higher reliability. Then, a "formation step" for cutting and processing the lead is performed (Step S727).

Next, a "marking step" for printing (marking) a surface of the package is performed (Step S728). Then, after a "testing step" (Step S729) for checking whether an external shape is good and whether there is malfunction, for example, the electronic component is completed (Step S729).

Figure 20B:
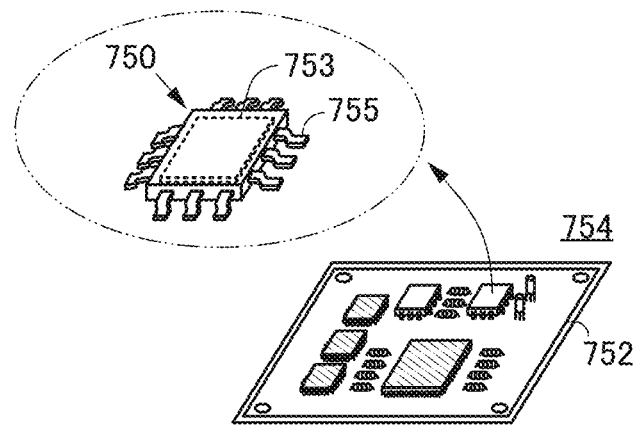
FIG. 20B is a schematic perspective view of an electronic component.

FIG. 20B shows a perspective schematic view of the completed electronic component. FIG. 20B shows a perspective schematic view of a QFP (Quad Flat Package) as an example of the electronic component. An electronic component 750 shown in FIG. 20B includes a lead 755 and a semiconductor device 753. As the semiconductor device 753, the memory device or the semiconductor device described in any of the above embodiments can be used, for instance.

The electronic component 750 shown in FIG. 20B is mounted on a printed circuit board 752, for example. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Examples of an electronic device including the semiconductor device or the electronic components of one embodiment of the present invention are described with reference to FIG. 21.

Examples of electronic devices including the semiconductor device or electronic component of one embodiment of the present invention include display devices of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, cellular phones, car phones, portable game machines, tablet terminals, large game machines such as pinball machines, calculators, information terminals which are portable (also referred to as "portable information terminal"), electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given.

In addition, moving objects driven by electric motors using power from power storage devices are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft.

The semiconductor device or electronic component of one embodiment of the present invention can be used for communication devices in any of the electronic devices.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) and the like.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21:
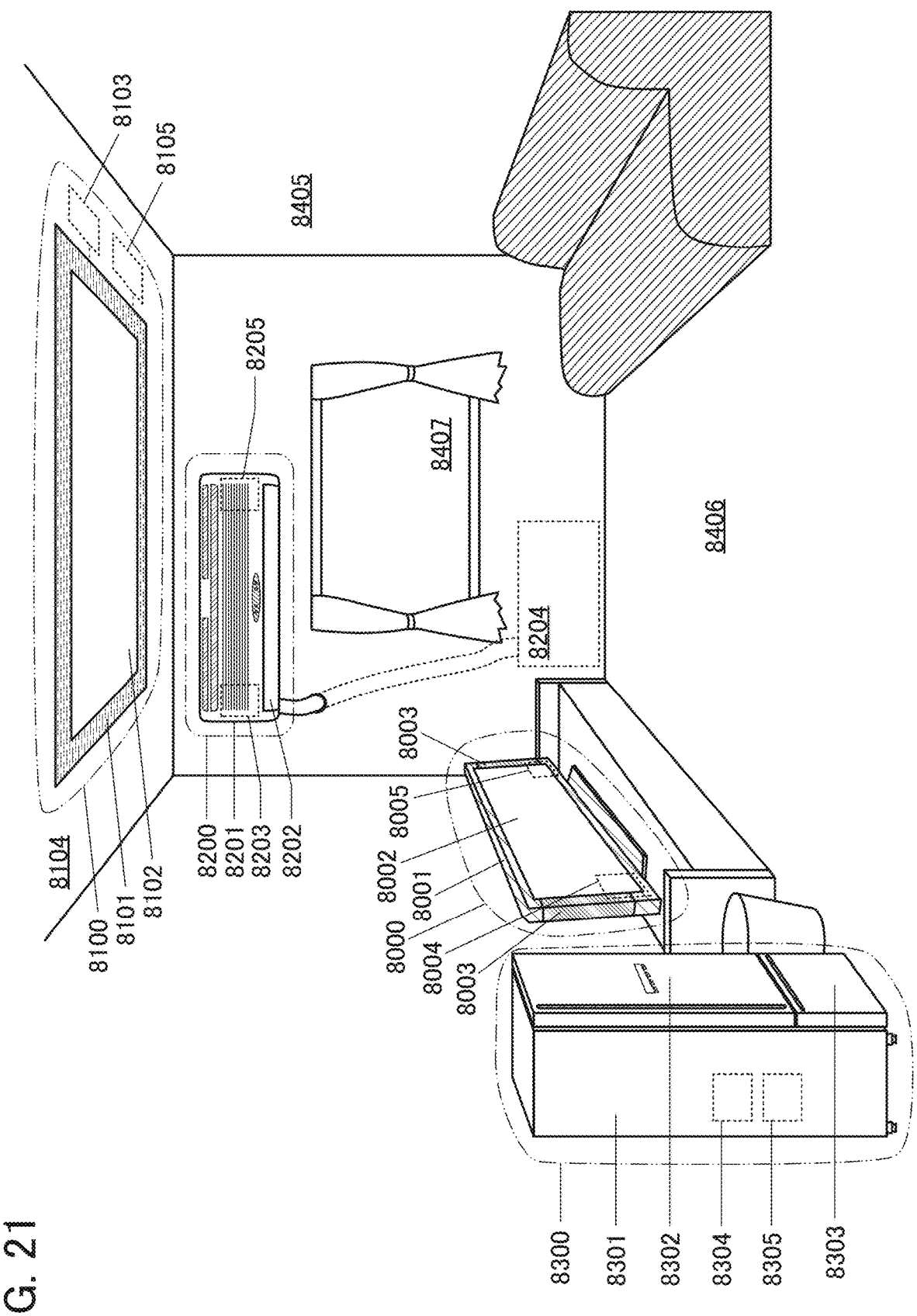
FIG. 21 is a diagram showing examples of electronic devices.

FIG. 21 and FIG. 22A to FIG. 22F show examples of electronic devices. In FIG. 21, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. With the semiconductor device 8004, control data, control programs, and the like can be retained. The semiconductor device 8004 has a communication function; the display device 8000 can function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoretic display device, a digital micromirror device (DMD), a plasma display panel (PDP), or a field emission display (FED) can be used for the display portion 8002.

Note that the display device includes, in its category, all of information display devices for personal computers, advertisement display, and the like besides for TV broadcast reception.

In FIG. 21, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although the case where the semiconductor device 8103 is provided in a ceiling 8104 on which the housing 8101 and the light source 8102 are installed is shown in FIG. 21 as an example, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device 8103.

Note that although the installation lighting device 8100 provided in the ceiling 8104 is shown in FIG. 21 as an example, the semiconductor device of one embodiment of the present invention can be used in an installation lighting device provided in, for example, a wall 8405, a floor 8406, a window 8407, or the like other than the ceiling 8104, and can be also used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 21, an air conditioner including an indoor unit 8200 and an outdoor unit 8204 is an example of an electronic device including a semiconductor device 8203 of one embodiment of the present invention. The indoor unit 8200 includes a housing 8201, an air outlet 8202, a semiconductor device 8203, a power storage device 8205, and the like. Although FIG. 21 shows the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive electric power from a commercial power supply. Alternatively, the air conditioner can use electric power stored in the power storage device 8205.

Note that although the separated air conditioner composed of the indoor unit and the outdoor unit is shown in FIG. 21 as an example, the semiconductor device of one embodiment of the present invention can be used in an integrated air conditioner in which the function of an indoor unit and the function of an outdoor unit are included in one housing.

In FIG. 21, an electric refrigerator-freezer 8300 is an example of an electronic device including a semiconductor device 8304 of one embodiment of the present invention. Specifically, the electric refrigerator-freezer 8300 includes a housing 8301, a door for a refrigerator 8302, a door for a freezer 8303, the semiconductor device 8304, a power storage device 8305, and the like. The power storage device 8305 is provided in the housing 8301 in FIG. 21. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply. Alternatively, the electric refrigerator-freezer 8300 can use electric power stored in the power storage device 8305.

Figure 22A:
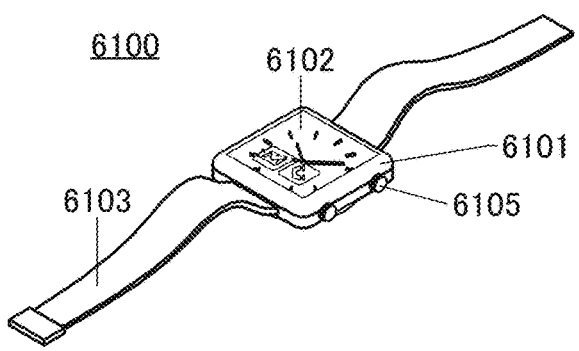
FIG. 22A to FIG. 22F are diagrams showing examples of electronic devices.

FIG. 22A shows an example of a wrist-watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 22B:
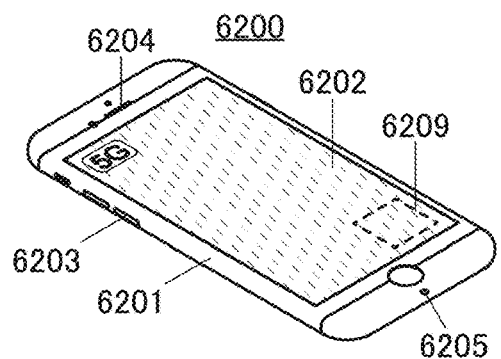

FIG. 22B shows an example of a mobile phone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 22C:
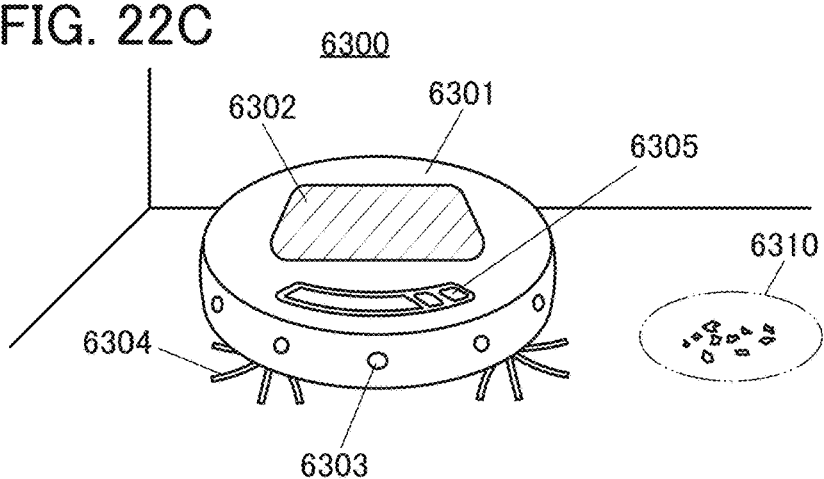
Figure 22D:
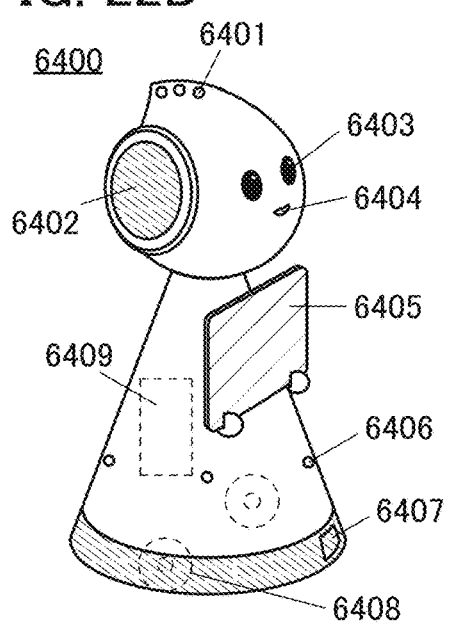

FIG. 22C shows an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not shown, a cleaning robot 6300 is provided with a tire, an inlet, and the like. The cleaning robot 6300 can run autonomously, detect dust 6310, and vacuum the dust through the inlet provided on a bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected through image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

FIG. 2D shows an example of a robot. A robot 6400 shown in FIG. 22D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 also has a function of outputting sound. The robot 6400 can communicate with a user using the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect, with the use of the moving mechanism 6408, the presence of an obstacle in the direction where the robot 6400 advances. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 22E:
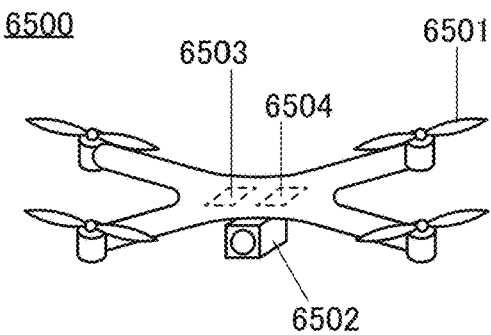

FIG. 22E shows an example of a flying object. A flying object 6500 shown in FIG. 22E includes propellers 6501, a camera 6502, a battery 6503, and the like and has a function of flying autonomously.

For example, image data taken by the camera 6502 is stored in an electronic component 6504. The electronic component 6504 can analyze the image data to sense whether there are obstacles when the flying object moves. Moreover, the electronic component 6504 can estimate the remaining battery level from change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 22F:
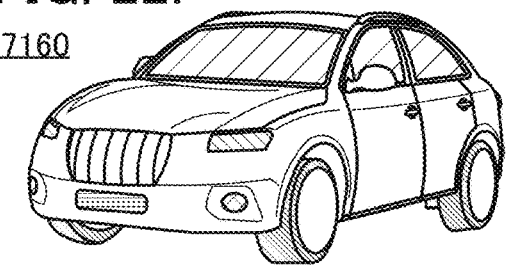

FIG. 22F shows an example of an electric vehicle. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The composition, structure, method, and the like described above in this example can be used in combination as appropriate with the compositions, structures, methods, and the like described in the other embodiments, the example, and the like.

Embodiment 8

The semiconductor device of one embodiment of the present invention includes a normally-off CPU (also referred to as "Noff CPU") or the like. Note that the Noff CPU is an integrated circuit including a normally-off transistor, which is in a non-conduction state (also referred to as an off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewiring of setting conditions or the like. In other words, high-speed return from the standby state is possible. As described here, the power consumption of the Noff CPU can be reduced without a significant decrease in operation speed.

The Noff CPU can be suitably used for a small-scale system such as an IoT end device (also referred to as an "endpoint microcomputer") 803 in the IoT field, for example.

Figure 23:
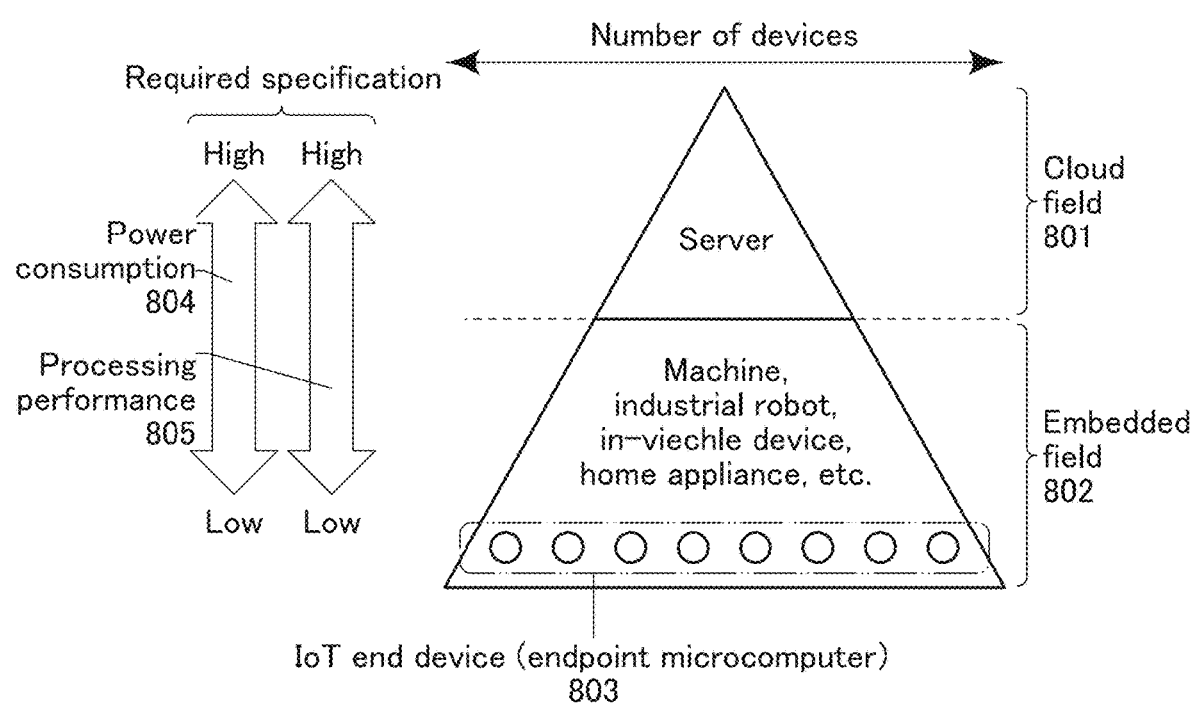
FIG. 23 is a diagram showing a hierarchical structure of an IoT network and tendencies of required specifications.

FIG. 23 shows a hierarchical structure of an IoT network and tendencies of required specifications. FIG. 23 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased. The semiconductor device of one embodiment of the present invention can be suitably used for a communication device in the IoT end device that needs to have low power consumption.

Note that an "endpoint" refers to an end region of the embedded field 802. Examples of devices used in the endpoint include microcomputers used in a factory, a home appliance, infrastructure, agriculture, and the like.

Figure 24:
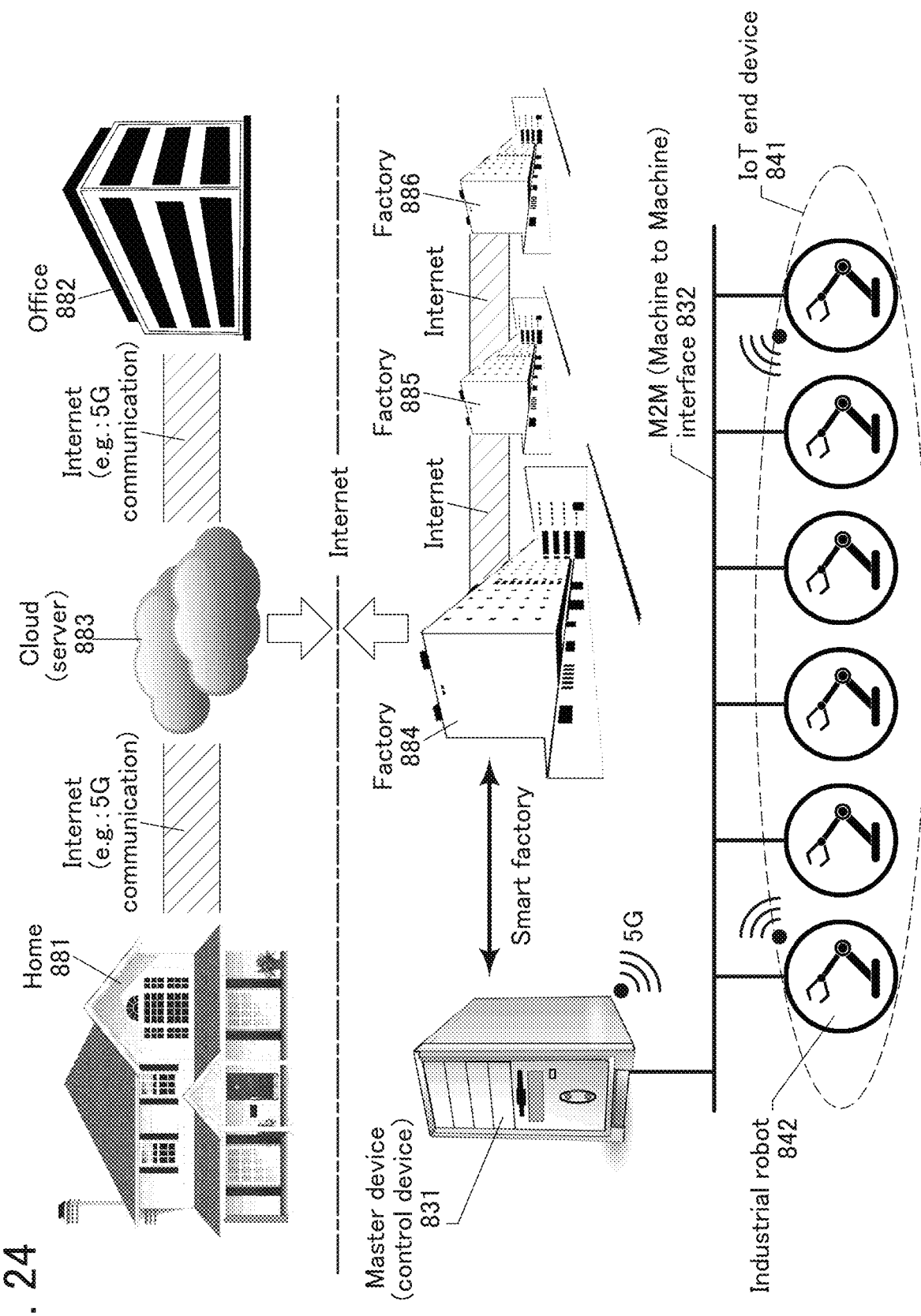
FIG. 24 is a conceptual diagram of factory automation.

FIG. 24 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. In the case of wireless communication, for example, wireless communication based on a communication standard such as the fourth-generation mobile communications system (4G) or the fifth-generation mobile communications system (5G) is performed using the semiconductor device of one embodiment of the present invention for a communication device. The factory 884 may be connected to a factory 885 and a factory 886 through the Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff CPU. Meanwhile, the embedded field of IoT sometimes requires quick response; the use of the Noff CPU achieves high-speed return from a standby state.

The composition, structure, method, and the like described above in this embodiment can be used in combination as appropriate with the compositions, structures, methods, and the like described in the other embodiments, the example, and the like.

REFERENCE NUMERALS

S721: step, S722: step, S723: step, S724: step, S725: step, S726: step, S727: step, S728: step, S729: step, 10: circuit, 20: semiconductor device, 100: wiring, 100a: conductor, 101: capacitor, 101a: capacitor, 102: wiring, 102a: conductor, 102b: conductor, 102c: conductor, 102d: conductor, 102e: conductor, 102f: conductor, 102g: conductor, 102h: conductor, 102i: conductor, 102j: conductor, 103: load, 103a: common source amplifier, 104: capacitor portion, 105: transistor, 105a: transistor, 105b: transistor, 105t: transistor, 120: DC-DC converter, 121: smoothing circuit, 122: inductor, 123: capacitor, 125: terminal, 127: matching circuit, 128: matching circuit, 129: transistor, 130: wiring, 131: capacitor, 132: inductor, 133: inductor, 134: capacitor, 150a: conductor, 150b: conductor, 150c: conductor, 150d: conductor, 150e: conductor, 150f: conductor, 150g: conductor, 150h: conductor, 150i: conductor, 150j: conductor, 160: region, 161: conductor, 162: conductor, 163: conductor, 200: wiring, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500A: OS transistor, 503: conductor, 503a: conductor, 503b: conductor, 504: conductor, 504a: conductor, 504b: conductor, 510: insulator, 512: insulator, 514: insulator, 516: insulator, 522: insulator, 524: insulator, 530: oxide, 530a: oxide, 530b: oxide, 530c1: oxide, 530c2: oxide, 540a: conductor, 540b: conductor, 540c: conductor, 540d: conductor, 540e: conductor, 540f: conductor, 540g: conductor, 540h: conductor, 540i: conductor, 540j: conductor, 541a: conductor, 541b: conductor, 541c: conductor, 542a: conductor, 542b: conductor, 543a: region, 543b: region, 544: insulator, 545: insulator, 546a: oxide, 546b: oxide, 550: transistor, 560: conductor, 560a: conductor, 560b: conductor, 574: insulator, 580: insulator, 581: insulator, 582: insulator, 586: insulator, 590: conductor, 592: conductor, 594: insulator, 595a: conductor, 595b: conductor, 597: conductor, 598: conductor, 600: capacitor, 601: capacitor, 650: insulator, 651: insulator, 652: insulator, 653: insulator, 711: substrate, 712: circuit region, 713: separation region, 714: separation line, 715: chip, 750: electronic component, 752: printed circuit board, 753: semiconductor device, 754: circuit board, 755: lead, 801: cloud field, 802: field, 803: IoT end device, 804: power consumption, 805: processing performance, 831: master device, 832: interface, 841: IoT end device, 842: industrial robot, 881: home, 882: office, 883: cloud, 884: factory, 885: factory, 886: factory, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: door for a refrigerator, 8303: door for a freezer, 8304: semiconductor device, 8305: power storage device, 8405: wall, 8406: floor, 8407: window

The invention claimed is:

1. A semiconductor device, comprising:
    a transistor, a load, and a wiring configured to supply a power supply potential to the load,
    wherein a semiconductor layer of the transistor comprises an oxide semiconductor,
    wherein a first gate of the transistor comprises a region overlapping with a second gate of the transistor with the semiconductor layer of the transistor therebetween,
    wherein a source and a drain of the transistor are electrically connected to the wiring,
    wherein the first gate of the transistor and the second gate of the transistor are supplied with a reference potential, and
    wherein the semiconductor layer of the transistor comprises a region overlapping with the wiring.

2. A semiconductor device, comprising:
    a first transistor, a second transistor, a load, and a wiring configured to supply a power supply potential to the load,
    wherein a semiconductor layer of the first transistor comprises an oxide semiconductor,
    wherein a semiconductor layer of the second transistor comprises an oxide semiconductor,
    wherein a source and a drain of the first transistor are electrically connected to the wiring,
    wherein a first gate of the first transistor is supplied with a reference potential,
    wherein a source and a drain of the second transistor are supplied with the reference potential,
    wherein a first gate of the second transistor is electrically connected to the wiring,
    wherein the semiconductor layer of the first transistor comprises a region overlapping with the wiring, and
    wherein the semiconductor layer of the second transistor comprises a region overlapping with the wiring.

3. A semiconductor device, comprising:
a first transistor, a second transistor, a load, and a wiring configured to supply a power supply potential to the load,
wherein a semiconductor layer of the first transistor comprises an oxide semiconductor,
wherein a semiconductor layer of the second transistor comprises an oxide semiconductor,
wherein a first gate of the first transistor comprises a region overlapping with a second gate of the first transistor with the semiconductor layer of the first transistor therebetween,
wherein a first gate of the second transistor comprises a region overlapping with a second gate of the second transistor with the semiconductor layer of the second transistor therebetween,
wherein a source and a drain of the first transistor are electrically connected to the wiring,
wherein the first gate of the first transistor and the second gate of the first transistor are supplied with a reference potential,
wherein a source and a drain of the second transistor are supplied with a reference potential,
wherein the first gate of the second transistor and the second gate of the second transistor are electrically connected to the wiring,
wherein the semiconductor layer of the first transistor comprises a region overlapping with the wiring, and
wherein the semiconductor layer of the second transistor comprises a region overlapping with the wiring.

* * * * *